(12) United States Patent
Furukawa et al.

(10) Patent No.: US 12,393,117 B2
(45) Date of Patent: Aug. 19, 2025

(54) MARKER, METHOD FOR MANUFACTURING MARKER, AND DETECTION TARGET

(71) Applicant: DAI NIPPON PRINTING CO., LTD., Tokyo (JP)

(72) Inventors: Tadashi Furukawa, Tokyo (JP); Koujiro Ookawa, Tokyo (JP); Yukio Taniguchi, Tokyo (JP); Hideaki Fujisaki, Tokyo (JP); Keiji Kashima, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/797,007

(22) PCT Filed: Jan. 29, 2021

(86) PCT No.: PCT/JP2021/003291
§ 371 (c)(1),
(2) Date: Aug. 2, 2022

(87) PCT Pub. No.: WO2021/157484
PCT Pub. Date: Aug. 12, 2021

(65) Prior Publication Data
US 2023/0068581 A1   Mar. 2, 2023

(30) Foreign Application Priority Data

Feb. 6, 2020 (JP) ................................. 2020-018793
Feb. 6, 2020 (JP) ................................. 2020-018794
(Continued)

(51) Int. Cl.
*G03F 7/105* (2006.01)
*B32B 7/12* (2006.01)
(Continued)

(52) U.S. Cl.
CPC ............ *G03F 7/105* (2013.01); *G01B 11/002* (2013.01); *G02B 5/0284* (2013.01); *B32B 7/12* (2013.01);
(Continued)

(58) Field of Classification Search
CPC ... B32B 17/063; B32B 17/10; B32B 2255/26; B32B 2255/28; B32B 2264/0214;
(Continued)

(56) References Cited

U.S. PATENT DOCUMENTS 8,625,107 B2    1/2014  Kusik et al.
2007/0085849 A1*  4/2007  Kosolapov ......... G01B 11/2509
                                                    345/589
(Continued)

FOREIGN PATENT DOCUMENTS

CN      1283840 A    2/2001
CN    102053490 A    5/2011
(Continued)

OTHER PUBLICATIONS

Sep. 13, 2022 International Search Report issued in International Application No. PCT/JP2022/028106.
(Continued)

*Primary Examiner* — Sunghee Y Gray
(74) *Attorney, Agent, or Firm* — Oliff PLC

(57) ABSTRACT

A high-precision marker, which is easy to manufacture, has a base material layer, a first layer which is laminated onto one surface of the base material layer, and which is observed in a first color, and a second layer which is partially laminated onto the first layer, is observed in a second color different from the first color, and partially conceals the first layer, wherein the first layer is observable in a region in which the second layer is not laminated, and the second layer is formed by a resist material.

23 Claims, 28 Drawing Sheets

(30) Foreign Application Priority Data

Mar. 12, 2020 (JP) .................................. 2020-042776
Oct. 1, 2020 (JP) .................................. 2020-166906

(51) Int. Cl.
| | |
|---|---|
| B32B 17/06 | (2006.01) |
| B32B 17/10 | (2006.01) |
| B32B 25/08 | (2006.01) |
| B32B 25/20 | (2006.01) |
| B32B 27/30 | (2006.01) |
| B32B 27/32 | (2006.01) |
| B32B 27/36 | (2006.01) |
| B32B 27/38 | (2006.01) |
| G01B 11/00 | (2006.01) |
| G02B 5/02 | (2006.01) |
| G06K 19/06 | (2006.01) |

(52) U.S. Cl.
CPC ............. *B32B 17/063* (2013.01); *B32B 17/10* (2013.01); *B32B 25/08* (2013.01); *B32B 25/20* (2013.01); *B32B 27/304* (2013.01); *B32B 27/32* (2013.01); *B32B 27/325* (2013.01); *B32B 27/36* (2013.01); *B32B 27/365* (2013.01); *B32B 27/38* (2013.01); *B32B 2255/26* (2013.01); *B32B 2255/28* (2013.01); *B32B 2264/0214* (2013.01); *B32B 2270/00* (2013.01); *B32B 2307/412* (2013.01); *B32B 2307/416* (2013.01); *B32B 2519/00* (2013.01); *G06K 19/06037* (2013.01)

(58) Field of Classification Search
CPC .......... B32B 2270/00; B32B 2307/412; B32B 2307/416; B32B 25/08; B32B 25/20; B32B 2519/00; B32B 27/304; B32B 27/32; B32B 27/325; B32B 27/36; B32B 27/365; B32B 27/38; B32B 7/12; G01B 11/002; G01B 11/26; G01C 15/04; G02B 5/0284; G03F 7/105; G06K 19/06037
USPC ........................................................ 356/614
See application file for complete search history.

(56) References Cited

U.S. PATENT DOCUMENTS

| | | | |
|---|---|---|---|
| 2011/0186625 A1* | 8/2011 | Mangione-Smith | ........................ C07K 14/70503 235/494 |
| 2013/0342910 A1 | 12/2013 | Schaur et al. | |
| 2014/0319815 A1 | 10/2014 | Sekine et al. | |
| 2017/0334232 A1 | 11/2017 | Yashiki et al. | |
| 2018/0188663 A1 | 7/2018 | Levinski et al. | |
| 2019/0228541 A1 | 7/2019 | Tanaka | |
| 2020/0011655 A1 | 1/2020 | Fukuda et al. | |
| 2020/0158500 A1 | 5/2020 | Saito et al. | |
| 2021/0027547 A1* | 1/2021 | Walters | ................... G06T 19/20 |
| 2021/0031553 A1* | 2/2021 | Brehm | ................. B42D 25/373 |
| 2021/0156680 A1 | 5/2021 | Luo | |

FOREIGN PATENT DOCUMENTS

| | | |
|---|---|---|
| CN | 102053509 A | 5/2011 |
| CN | 102935769 A | 2/2013 |
| CN | 103415801 A | 11/2013 |
| CN | 103930283 A | 7/2014 |
| CN | 107148583 A | 9/2017 |
| CN | 109716061 A | 5/2019 |
| CN | 110337579 A | 10/2019 |
| CN | 110869697 A | 3/2020 |
| CN | 111862208 A | 10/2020 |
| CN | 112766008 A | 5/2021 |
| JP | H05-312521 A | 11/1993 |
| JP | 2001-255118 A | 9/2001 |
| JP | 2005-300227 A | 10/2005 |
| JP | 2010-085212 A | 4/2010 |
| JP | 2012-123287 A | 6/2012 |
| JP | 2012-237597 A | 12/2012 |
| JP | 2013-238628 A | 11/2013 |
| JP | 2014-164462 A | 9/2014 |
| JP | 2017-116521 A | 6/2017 |
| WO | 2016/024555 A1 | 2/2016 |
| WO | 2019/026817 A1 | 2/2019 |
| WO | 2019/162732 A1 | 8/2019 |

OTHER PUBLICATIONS

Mar. 30, 2021 Search Report issued in International Patent Application No. PCT/JP2021/003291.
Oct. 5, 2021 Decision to Grant Patent issued in Japanese Patent Application No. 2021-533510.
Dec. 6, 2022 Office Action issued in Chinese Patent Application No. CN202180012380.9.
Shuiping et al. "College Physics Experiment Course", China Machine Press, 2019, pp. 252.
Jun. 21, 2023 Office Action issued in Chinese Patent Application No. 202180012380.9.
Jun. 21, 2023 Search Report issued in European Patent Application No. 21750058.6.
Hideyuki Tanaka "Basics and Trends of AR Marker Technologies", IEICE Journal vol. 97, No. 8, 2014, p. 734-740.
"Detection of ArUco Markers" the search date: Mar. 23, 2022, Internet <URL :https://docs.opencv.org/4.x/d5/dae/tutorial_aruco_detection.html>.

* cited by examiner (a)  (b)

MARKER, METHOD FOR MANUFACTURING MARKER, AND DETECTION TARGET

TECHNICAL FIELD

The present invention relates to a marker, a method for manufacturing a marker, and a detection target.

BACKGROUND ART

Markers are attached to targets so as to enable various automatic control devices to recognize the targets, thereby performing highly accurate automatic control. Such markers are used, for example, for the control of robots at production sites and for space missions. As these markers, markers printed on paper have been conventionally widely used because they are easy to produce. However, with such simple markers, the boundary line of the mark is unclear, and the size of the mark and the spacing between multiple marks change due to the expansion and contraction of paper, so that sufficient accuracy cannot be ensured when highly accurate control is required.

Therefore, as a technique for achieving a highly accurate marker, Patent Document 1 discloses a technique for making holes in a metal plate by cutting work and filling the holes with resin to form a marker. However, according to the technique of Patent Document 1, it takes a lot of time and labor to manufacture markers because it is necessary to enhance the accuracy of machining, and also there is a limit to enhancing the accuracy. Further, according to the technique of Patent Document 1, under some observation environments, sunlight, illumination light, or the like may be reflected from the surface of the metal plate or the surface of the resin, so that markers may not be recognized correctly. Markers are attached so as to enable various automatic control devices to recognize the targets, thereby performing highly accurate automatic control. Such markers are used, for example, for the control of robots at production sites and for space missions. As a target for a motion tracking system, Patent Document 2 discloses a technique according to which patterns are formed on both front and back surfaces of a transparent board to display moire.

However, although the technique disclosed in Patent Document 2 enables moire to be displayed, the moire is shielded by the patterns themselves, so that the displayed moire is observed to be very dark. Therefore, the practicability of this technique is low.

Patent Document 1: Japanese Unexamined Patent Application, Publication No. H5-312521
Patent Document 2: U.S. Pat. No. 8,625,107

DISCLOSURE OF THE INVENTION

Problems to be Solved by the Invention

An object of the present invention is to provide a marker that is easy to manufacture and has high accuracy. Another object of the present invention is to provide a marker capable of displaying moire brightly. Another object of the present invention is to provide a marker that is easy to recognize even under an environment where sunlight, illumination light, or the like hits the marker.

Means for Solving the Problems

The present invention solves the above-mentioned problems by the following solving means. In order to facilitate understanding, the description will be given with reference signs corresponding to the embodiments of the present invention, but the present invention is not limited thereto.

A first aspect of the present invention is directed to a marker (1, 1B, 1C) including a base material layer (10), a first layer (20, 20C) that is laminated on an observation side of the base material layer (10), and is observed in a first color, and a second layer (30, 30C) that is partially laminated on an observation side of the first layer (20, 20C) and observed in a second color different from the first color, and partially conceals the first layer (20, 20C). The first layer (20, 20C) is observable in a region where the second layer (30, 30C) is not laminated, and the second layer (30, 30C) includes a resist material.

A second aspect of the present invention is an embodiment of the marker (1, 1B, 1C) according to the first aspect. In the marker (1, 1B, 1C) according to the second aspect, the first layer (20, 20C) includes a resist material.

A third aspect of the present invention is an embodiment of the marker (1C) according to the first or second aspect. In the marker (1C) according to the third aspect, the second layer (30C) has a higher concealing capacity for concealing a base than the first layer (20C).

A fourth aspect of the present invention is an embodiment of the marker according to any one of the first to third aspects. In the marker (1C) according to the fourth aspect, the second layer (30C) has a layer thickness of 5 µm or less.

A fifth aspect of the present invention is an embodiment of the marker (1C) according to any one of the first to fourth aspects. The marker (1C) according to the fifth aspect further includes a flattening layer (91) that fills a step between the first layer and the second layer in a lamination direction.

A sixth aspect of the present invention is an embodiment of the marker (1C) according to the fifth aspect. In the marker (1C) according to the sixth aspect, a step between the second layer (30c) and the flattening layer (91) in the lamination direction is equal to or less than 5 µm.

A seventh aspect of the present invention is an embodiment of the marker (1, 1B, 1C) according to any one of the first to sixth aspects. The marker (1, 1B, 1C) according to the seventh aspect further includes a protective layer (70, 70C) that is laminated to protect the first layer (20, 20C) and the second layer (30, 30C).

An eighth aspect of the present invention is an embodiment of the marker (1, 1B, 1C) according to the seventh aspect. In the marker (1, 1B, 1C) according to the eighth aspect, the protective layer (70, 70C) has an antireflection function.

A ninth aspect of the present invention is an embodiment of the marker (1, 1B, 1C) according to any one of the first to eighth aspects. In the marker (1, 1B, 1C) according to the ninth aspect, the base material layer (10) has a linear expansion coefficient of $10 \times 10^{-6}/°$ C. or less.

A tenth aspect of the present invention is an embodiment of the marker (1, 1B, 1C) according to any one of the first to ninth aspects. In the marker (1, 1B, 1C) according to the tenth aspect, the base material layer (10) includes glass.

An eleventh aspect of the present invention is an embodiment of the marker (1, 1B, 1C) according to any one of the first to tenth aspects. In the marker (1, 1B, 1C) according to the eleventh aspect, a contrast value observed between the first color and the second color is equal to or more than 0.26, and a blur value observed between the first color and the second color is equal to or more than 1.0.

A twelfth aspect of the present invention is an embodiment of the marker (1, 1B, 1C) according to any one of the first to eleventh aspects. In the marker (1, 1B, 1C) according to the twelfth aspect, one of the first color and the second color is white, and the other is black.

A thirteenth aspect of the present invention is an embodiment of the marker (1, 1B, 1C) according to the eleventh aspect. In the marker (1, 1B, 1C) according to the thirteenth aspect, under observation using light in a specific wavelength region, a contrast value between the first color and the second color is equal to or more than 0.26, and under visible light, a contrast value between the first color and the second color is equal to or less than 1.0.

A fourteenth aspect of the present invention is an embodiment of the marker (1, 1B, 1C) according to the thirteenth aspect. In the marker (1, 1B, 1C) according to the fourteenth aspect, the specific wavelength region is a near-infrared ray wavelength region of 780 nm or more.

A fifteenth aspect of the present invention is an embodiment of the marker (1, 1B, 1C) according to any one of the first to fourteenth aspects. In the marker (1, 1B, 1C) according to the fifteenth aspect, one of the first layer (20) and the second layer (30) is observable as a mark having an independent shape, and the mark includes three or more marks which are arranged to be spaced from one another.

A sixteenth aspect of the present invention is directed to a marker multi-imposition body (100) including a plurality of markers (1, 1B, 1C) according to the fifteenth aspect, the plurality of markers being arranged in a multi-imposition style. Dimensional variation in external shapes of the marks (2) in one sheet of the multi-imposition body and dimensional variation in arrangement pitches between the marks (2) in each of the markers (1, 1B, 1C) are each ±10 μm or less.

A seventeenth aspect of the present invention is directed to a method for manufacturing a marker (1, 1B, 1C). The method includes: a first layer forming step of laminating a first layer (20, 20C) including a resist material and to be observed in a first color on one surface of a base material layer (10) including glass, a first exposure step of exposing the first layer (20, 20C) to light, a first developing step of developing the first layer (20, 20C), a first baking step of baking the first layer (20, 20C), a second layer forming step of laminating a second layer (30, 30C) including a resist material and to be observed in a second color on the first layer (20, 20C) which has been stabilized, a second exposure step of exposing the second layer (30, 30C) to light via a mark pattern, a second developing step of developing the second layer (30, 30C), and a second baking step of baking the second layer (30, 30C).

An eighteenth aspect of the present invention is directed to a plate-shaped marker (1, 1B, 1C) for measurement of a position and/or a posture from a camera. The plate-shaped marker includes: a base material layer (10), a first layer (20, 20C) that is laminated on an observation side of the base material layer (10), and is laminated on an entire surface of the base material layer (10) and observed in a first color, and a second layer (30, 30C) that is partially laminated on an observation side of the first layer (20, 20C), is observed in a second color different from the first color, and partially conceals the first layer (20, 20C), wherein the first layer (20, 20C) is observable in a region where the second layer (30, 30C) is not laminated, and the base material layer (10) has a linear expansion coefficient of $10 \times 10^{-6}/°$ C. or less.

A nineteenth aspect of the present invention is an embodiment of the marker (1, 1B, 1C) according to the eighteenth aspect. In the marker (1, 1B, 1C) according to the nineteenth aspect, the base material layer (10) includes glass.

A twentieth aspect of the present invention is an embodiment of the marker (1, 1B, 1C) according to the eighteenth or nineteenth aspect. In the marker (1, 1B, 1C) according to the twentieth aspect, one of the first layer (20, 20C) and the second layer (30, 30C) is observable as a mark (2) having an independent shape, and the mark (2) includes three or more marks which are arranged to be spaced from one another.

A twenty first aspect of the present invention is an embodiment of the marker (1, 1B, 1C) according to the twentieth aspect. In the marker (1, 1B, 1C) according to the twenty first aspect, the mark (2) includes three or more marks that are arranged on a peripheral portion of the plate-shaped marker (1, 1B, 1C) so as to be spaced from one another, and a FIG. 5) for identification is arranged at a center portion of the plate-shaped marker (1, 1B, 1C).

A twenty second aspect of the present invention is an embodiment of the marker (1, 1B, 1C) according to the twenty first aspect. In the marker (1, 1B, 1C) according to the twenty second aspect, the figure for identification is one of a two-dimensional bar code, a three-dimensional bar code, a QR code, and ArUco.

A twenty third aspect of the present invention is an embodiment of the marker according to any one of the first to twenty second aspects or the eighteenth to twenty second aspects. The marker (1) according to the twenty third aspect includes a first pattern (23) that is provided in at least a partial region on one surface of the base material layer (10), and has a plurality of first display lines (21) arranged at equal intervals in a fixed arrangement direction, and a second pattern (43) that is provided to be spaced from the first pattern (23) in a thickness direction of the base material layer (10), and has a plurality of second display lines (41) arranged at equal intervals in the fixed arrangement direction, the marker having a moire display region (3, 4) for displaying moire by a combination of the first pattern (23) and the second pattern (43), and when a portion which is located between the adjacent first display lines (21) and is provided with no first display line (21) is defined as a first non-display region (22), and a portion which is located between the adjacent second display lines (41) and is provided with no second display line (41) is defined as a second non-display region (42), the first non-display region (22) and the second non-display region (42) having different widths.

A twenty fourth aspect of the present invention is an embodiment of the marker (1) according to the twenty third aspect. In the marker (1) according to the twenty fourth aspect, the width of the first non-display region (22) is larger than the width of the second non-display region (42), and a side on which the first pattern (23) is provided is set as an observation side.

A twenty fifth aspect of the present invention is an embodiment of the marker (1) according to the twenty fourth aspect. In the marker (1) according to the twenty fifth aspect, a reflective layer (50) is laminated on a back surface side which is opposite to the observation side such that at least the second non-display region (42) is filled with the reflective layer (50).

A twenty sixth aspect of the present invention is an embodiment of the marker (1) according to the twenty fifth aspect. In the marker (1) according to the twenty sixth aspect, the reflective layer (50) is laminated so as to cover the entire second pattern (43) in the marker (1) described in the twenty fifth invention.

A twenty seventh aspect of the present invention is an embodiment of the marker (1) according to the twenty third to twenty sixth aspects. In the marker (1) according to the twenty seventh aspect, the first display lines (21) differ in width from the second display lines (41).

A twenty eighth aspect of the present invention is an embodiment of the marker (1) according to the twenty seventh aspect. In the marker (1) according to the twenty eighth aspect, the width of the first display lines (21) are smaller in width than the second display lines (41).

A twenty ninth aspect of the present invention is an embodiment of the marker (1) according to any one of the twenty third to twenty eighth aspects. In the marker (1) according to the twenty ninth aspect, the first display lines (21) are arranged at a first pitch, the second display lines (41) are arranged at a second pitch, and the first and second pitches are different from each other.

A thirtieth aspect of the present invention is an embodiment of the marker (1) according to the twenty ninth aspect. In the marker (1) according to the thirtieth aspect, the first pitch is larger than the second pith.

A thirty first aspect of the present invention is an embodiment of the marker (1) according to any one of the twenty third to thirtieth aspects. In the marker (1) according to the thirty first aspect, the moire display region (3, 4) is provided in a plurality of regions so that the fixed arrangement direction includes a plurality of different directions.

A thirty second aspect of the present invention is an embodiment of the marker (1) according to any one of the twenty third to thirty first aspects. In the marker (1) according to the thirty second aspect, marks (2) that are observable in an independent shape are arranged at least at three locations spaced from one another.

A thirty third aspect of the present invention is an embodiment of the marker (1) according to any one of the twenty third to thirty second aspects. The marker (1) according to the thirty third aspect is for use to detect a relative inclination angle between an observation position and the marker (1) in the marker (1) described in any one of the twenty third invention to the thirty second invention.

A thirty fourth aspect of the present invention is an embodiment of the marker according to any one of the first to fifteenth aspects or the eighteenth to thirty third aspects. The marker (1) according to the thirty fourth aspect is for use to detect at least one of a distance to an observation position and a relative inclination angle to the observation position, and is provided with a light diffusion layer (80) on an outermost surface thereof.

A thirty fifth aspect of the present invention is an embodiment of the marker (1) according to the thirty fourth aspect. In the marker (1) according to the thirty fifth aspect, the light diffusion layer (80) has micro asperities on a surface thereof.

A thirty sixth aspect of the present invention is an embodiment of the marker (1) according to the thirty fourth or thirty fifth aspect. In the marker (1) according to the thirty sixth aspect, the light diffusion layer (80) contains light-diffusing particles therein.

A thirty seventh aspect of the present invention is an embodiment of the marker (1) according to any one of the thirty fourth to thirty sixth aspects. In the marker (1) according to the thirty seventh aspect, marks (2) that are observable in an independent shape are arranged at least at three locations spaced from one another.

A thirty eighth aspect of the present invention is an embodiment of the marker (1) according to the thirty seventh aspect. In the marker (1) according to the thirty eighth aspect, the light diffusion layer (80) covers the marks (2) and is provided in an island-like shape in a range larger than each of the marks (2).

A thirty ninth aspect of the present invention is an embodiment of the marker (1) according to the thirty seventh aspect. In the marker (1) according to the thirty ninth aspect, each of the marks (2) having an independent shape and color of a peripheral portion thereof are different in reflectance, and the light diffusion layer (80) is provided so as to straddle a boundary between each of the marks (2) and the peripheral portion thereof in the marker (1) described in the thirty seventh invention.

A fortieth aspect of the present invention is an embodiment of the marker (1) according to any one of the thirty fourth to thirty ninth aspects. The marker (1) according to the fortieth aspect further includes a transparent base material layer (10), a first pattern (23) that is provided in at least a partial region on one surface of the transparent base material layer (10), and has a plurality of first display lines (21) arranged at equal intervals in a fixed arrangement direction, and a second pattern (43) that is provided to be spaced from the first pattern (23) in a thickness direction of the base material layer (10), and has a plurality of second display lines (41) arranged at equal intervals in the fixed arrangement direction, the marker (1) having a moire display region (3, 4) for displaying moire by a combination of the first pattern (23) and the second pattern (43).

A forty first aspect of the present invention is an embodiment of the marker (1) according to the fortieth aspect. In the marker (1) according to the forty first aspect, the light diffusion layer (80) covers the moire display region (3, 4), and is provided in an island-like shape in a range larger than the moire display region (3, 4) in the marker (1) described in the fortieth invention.

A forty second aspect of the present invention is an embodiment of the marker (1) according to the fortieth aspect. In the marker (1) according to the forty second aspect, the light diffusion layer (80) is provided so as to straddle a boundary between the moire display region (3, 4) and a peripheral portion thereof.

A forty third aspect of the present invention is an embodiment of the marker (1) according to any one of the first to fifteenth aspects or the eighteenth to forty second aspects. In the marker (1) according to the forty third aspect, the marker (1) is used by being attached to a detection target in the marker (1) described in any one of the first invention to the fifteenth invention or the eighteenth invention to the forty second invention.

A forty fourth aspect of the present invention is directed to a detection target (P) to which the marker (1) according to the forty third aspect is attached.

Effects of the Invention

The present invention provides the marker that is easy to manufacture and has high accuracy. The present invention provides the marker that is capable of displaying moire brightly. The present invention provides a marker that is easy to recognize even under an environment where sunlight, illumination light, or the like hits the marker.

PREFERRED MODE FOR CARRYING OUT THE INVENTION

Best modes for carrying out the present invention will be described with reference to the drawings and the like.

First Embodiment

Figure 1:
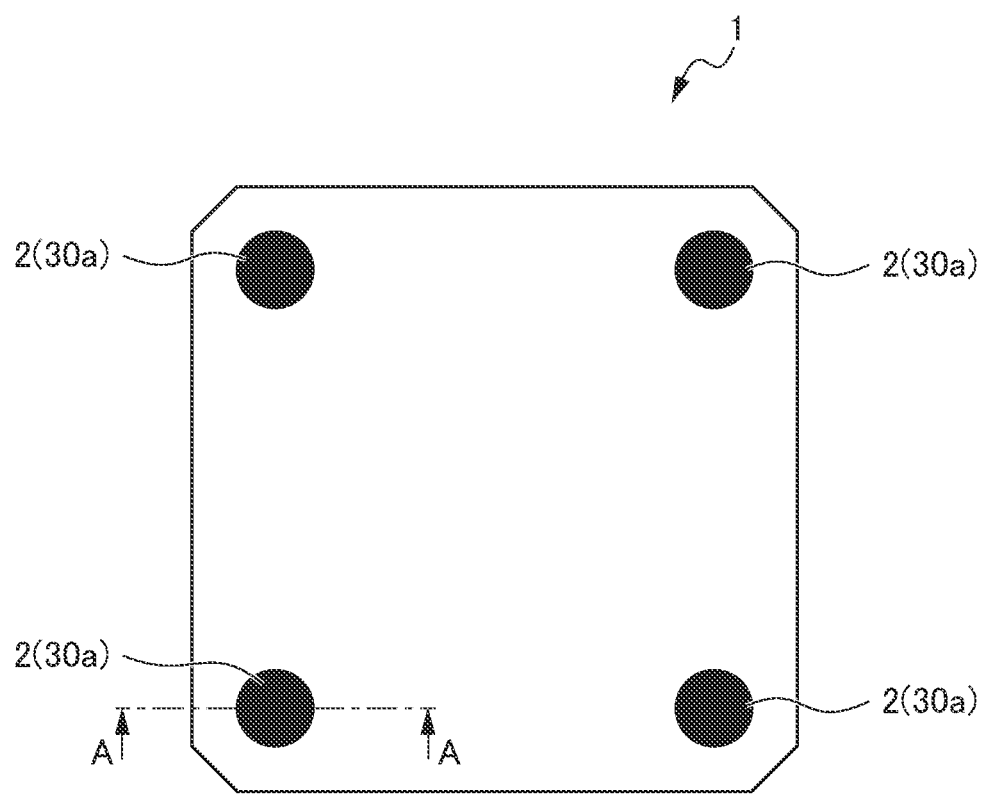
FIG. 1 is a diagram showing a marker 1 of a first embodiment.
Figure 2:
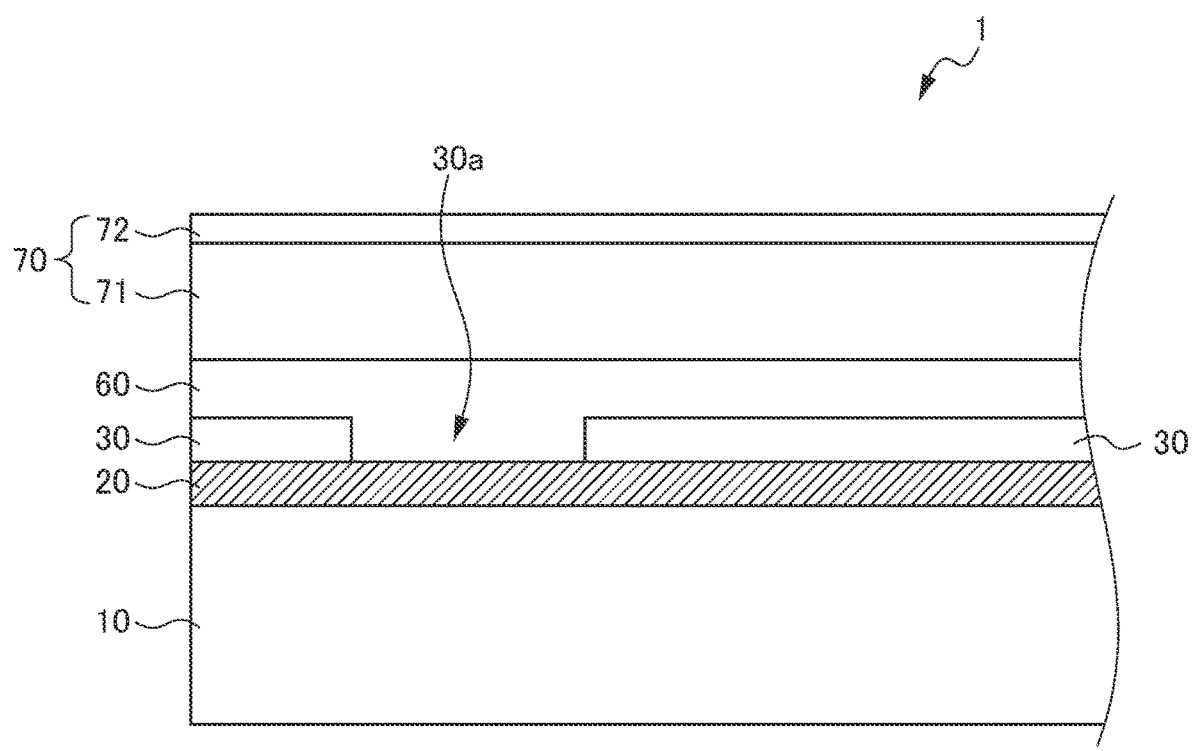
FIG. 2 is a cross-sectional view of the marker which is cut at the position of arrows A-A in FIG. 1.

FIG. 1 is a diagram showing a marker 1 of a first embodiment. FIG. 2 is a cross-sectional view of a marker which is cut at the position of arrows A-A in FIG. 1. The following figures including FIG. 1 and FIG. 2 are schematic diagrams, and the sizes and shapes of respective parts are presented by being exaggerated or omitted as appropriate to facilitate understanding thereof. Further, the following description will be made while presenting specific numerical values, shapes, materials, and the like, but these can be changed as appropriate. In the present specification, terms such as plate, sheet, and film are used. The terms of plate, sheet, and film are generally used in the decreasing order of thickness, and these terms are also used in the same way in the present specification. However, such a manner of use has no technical meaning, and thus these terms may be replaced as appropriate. Further, in the present invention, a "transparent" substance means a substance which transmits therethrough light having at least a wavelength to be used. For example, if a substance transmits infrared rays although it does not transmit visible light, the substance shall be treated as a transparent substance when used for applications using infrared rays. It should be noted that specific numerical values specified in the present specification and the claims should be treated as including a general error range. In other words, a difference of about ±10% is substantially the same, and a value set in a range slightly beyond the numerical range of the present invention should be interpreted as being substantially within the numerical range of the present invention.

As shown in FIG. 1, a marker 1 is configured like a plate having a substantially square shape when viewed from the normal direction of a surface on which a protective layer 70 described later is provided, and a plurality of marks 2 are arranged. In the present embodiment, the marker 1 is formed so that the shape thereof when viewed from the surface side is a substantially square shape of 60 mm×60 mm (a shape chamfered at each corner portion), and each of totally four circular marks 2 is provided near each of the four corners of the marker 1 so that the circular marks are arranged to be spaced from one another at intervals. It is desirable that at least three marks 2 are arranged. This is because, for example, if the positions of the centers of gravity of the marks 2 are calculated at three points from an observation result of the marks 2, the relative position, inclination, and posture between the observation position (camera or the like) and the marker 1 can be accurately detected. Further, if the number of marks 2 is larger than 3, for example, when some marks 2 are unclearly observed due to some kind of obstacle, the position detection can be performed from an observation result of the remaining marks 2. By using a plurality of marks 2, the accuracy of position detection can be improved.

The marker 1 is attached to, for example, a side surface of a measurement target such as a pallet on which luggage is placed, and can be used for automatic driving control of an automatic driving forklift or the like which has a camera. In other words, the relative positional relationship between the forklift and the pallet can be accurately grasped from a photographing result by the camera, and the operation of the forklift can be controlled based on the relative positional relationship. In such an application, it is desirable that the size of the marker 1 when viewed from the surface side of the marker 1 is equal to or less than 100 mm×100 mm. However, according to the marker 1 of the present embodiment, even such a small size enables extremely highly accurate position detection. The outer shape of the marker 1 is not limited to the above example, and can be appropriately changed to, for example, 10 mm×10 mm, 20 mm×20 mm, 40 mm×40 mm, 44 mm×44 mm, 80 mm×80 mm, or the like.

In the present embodiment, the mark 2 is configured in a circular shape, but the mark 2 is not limited to the circular shape, and may be a polygonal shape such as a triangle or a quadrangle, or another shape. The marker 1 is for use to detect the relative positional relationship between the imaging position and the marker 1 (hereinafter, also simply referred to as position detection) according to how the mark 2 is observed.

The marker 1 is configured in a thin plate-like shape by laminating a base material layer 10, a first layer 20, a second layer 30, an adhesive layer 60, and a protective layer 70 in this order from the back surface side thereof. In the description of the present specification and the claims, "lamination of layers" is not limited to a case where the layers are arranged to be directly laminated, but also includes a case where the layers are arranged to be laminated with another layer interposed therebetween. Further, a top side (a side on which the protective layer 70 is provided) in FIG. 2 is an observation side (front side).

The base material layer 10 includes a glass plate. By forming the base material layer 10 of a glass plate, it is possible to prevent the marker 1 from expanding and contracting due to temperature change and moisture absorption. The linear expansion coefficient of the glass plate is, for example, about $31.7 \times 10^{-7}/°$ C., and the dimensional change caused by the temperature change is very small. Further, the linear expansion coefficient of ceramics is, for example, about $28 \times 10^{-7}/°$ C., and the dimensional change caused by temperature change is very small like the glass. Therefore, ceramics may be used for the base material layer. In order to suppress the dimensional change caused by the temperature change, it is desirable that the base material layer 10 has a linear expansion coefficient of $10 \times 10^{-6}/°$ C. or less. It is desirable that the layer thickness of the base material layer 10 is set to 0.3 mm or more and 2.3 mm or less. If the layer thickness of the base material layer 10 is less than 0.3, additional machining cannot be performed because it cracks during cutting. If the layer thickness of the base material layer 10 is above 2.3, in the case of a multi-imposition substrate described later, the weight thereof is excessively large, so that it is impossible to transport the substrate.

The first layer 20 is formed of a resist material colored black (first color), and is laminated on the entire surface of the base material layer 10. In FIG. 2, hatching represents black color, and the same applies to the other cross-sectional views below. In the description of the present specification and claims, "resist material" is a photosensitive resin composition material containing a pigment or a dye. The resist material constituting the first layer 20 of the present embodiment is a resist material which has lost photosensitivity as a result of performing developing processing on a resist material having photosensitivity to be used in a photolithography step. Examples of the resist material to be used for the first layer 20 (in the case of black color) include PMMA, ETA, HETA, HEMA, a mixture with epoxy, and the like. Examples of the material to be colored black include carbon, titanium blackened, nickel oxide, and the like. In the present embodiment, since the first layer 20 is formed of the resist material, the surface of the first layer 20 can be formed very smoothly, which is desirable as a base for forming a second layer 30 described later. Further, since an alignment mark (not shown) when the second layer is formed can be formed on an outer peripheral portion of the first layer 20, the dimensional accuracy can be improved. It is desirable that the layer thickness of the first layer 20 (in the case of black) is set to 1 μm or more and 5 μm or less. This is because if the layer thickness of the first layer 20 is equal to or less than 1 μm, the first layer 20 cannot be uniformly formed, and if the layer thickness is 5 μm or more, curing reactivity of the resin by ultraviolet rays is insufficient.

The second layer 30 is formed of a resist material colored white (second color), and is laminated on the first layer 20 so as to be partially opened. The resist material constituting the second layer 30 of the present embodiment is a resist material which has lost photosensitivity as a result of performing developing processing on a resist material having photosensitivity to be used in the photolithography step. Examples of the resist material to be used for the second layer 30 (in the case of white color) include PMMA, ETA, HETA, HEMA, a mixture with epoxy, and the like. Examples of the material to be colored white include titanium oxide, zirconia, barium titanate, and the like. The second layer 30 is partially opened by photolithography processing described later to provide opening portions 30a visualizing the first layer 20 at four locations. In other words, the second layer 30 partially conceals the first layer 20, and unconcealed regions (regions where the second layer 30 is not laminated) are the opening portions 30a. The regions of the first layer 20 which are visualized by the opening portions 30a are configured to be observable as marks 2 having independent shapes. Note that a mark having an independent shape means that a plurality of marks are not connected and each of the marks has an individually recognizable form.

It is desirable that the layer thickness of the second layer 30 (in the case of white) is set to 3 μm or more and 100 or less. This is because if the layer thickness of the second layer 30 is smaller than 3 the first layer 20 of the base is observed to be seen through the second layer 30, so that the contrast is lowered, and the visibility of the mark 2 (easiness of detection by automatic recognition) deteriorates. Further, this is because if the layer thickness of the second layer 30 is larger than 100 in the case of observing the mark 2 in a diagonal direction, a region where the first layer 20 is shaded by the second layer 30 and cannot be seen at a peripheral edge portion of the opening portion 30a increases, so that the distortion of the observed shape of the mark 2 increases.

It is desirable that the mark 2 has a higher contrast value between the color of the first layer 20 and the color of the second layer 30 for more accurate detection. In the configuration of the present embodiment used under white light (visible light), it is desirable that the contrast value between the color of the first layer 20 (first color) and the color of the second layer 30 (second color) is equal to or more than 0.26, and the blur value observed between the color of the first layer 20 (first color) and the color of the second layer 30 (second color) is equal to or more than 0.17. The contrast value and the blur value will be described later with reference to FIG. 5.

The adhesive layer 60 is a layer of an adhesive for sticking the protective layer 70 onto the second layer 30. The adhesive layer 60 includes a transparent adhesive so that the first layer 20 and the second layer 30 can be observed. The adhesive layer 60 can be formed by using, for example, PMMA, urethane, silicone, or the like. It is desirable that the layer thickness of the adhesive layer 60 is set to 0.5 μm or more and 50 μm or less. This is because if the layer thickness of the adhesive layer 60 is less than 0.5 μm, uniforming processing is difficult and asperities of the base cannot be absorbed. Further, this is because if the layer thickness of the adhesive layer 60 is larger than 50 μm, it takes much time and labor to remove a solvent during thick coating processing, and the cost increases. The layer thickness of the adhesive layer 60 referred to here is the layer thickness at the position where the thickness is smallest.

The protective layer 70 is a layer for protecting the first layer 20 and the second layer 30, and is stuck onto the second layer 30 via the adhesive layer 60. The protective layer 70 has a resin base material layer 71 and a surface layer 72. The resin base material layer 71 can be configured by using, for example, vinyl chloride, polyethylene terephthalate, polycarbonate, cycloolefin polymer, triacetyl cellulose, or the like. The surface layer 72 can be configured by using, for example, an acrylic resin having a property of diffusing light by mixing fine particles, solgel, siloxane, polysilazane, or the like. However, when the surface of the resin base material layer 71 is embossed or the like so as to have asperities and to be imparted with a property of diffusing light, the surface layer 72 can be omitted. By adding the light diffusing function to the protective layer 70 as described above, the protective layer 70 can also have a function as a light diffusion layer.

The resin base material layer 71 has an adhesive layer 60 laminated on one surface thereof, and a surface layer 72 laminated on the other surface thereof. The resin base material layer 71 includes a transparent resin so that the first layer 20 and the second layer 30 can be observed. In the present embodiment, it is assumed that the marker 1 is used under visible light, and the adhesive layer 60 and the resin base material layer 71 are configured to be transparent to white light. Specifically, it is desirable that the adhesive layer 60 and the resin base material layer 71 each have a total light transmittance of 50% or more in a region where the wavelength of light is 400 nm to 700 nm. More desirably, the total light transmittance in the region where the wavelength of light is 400 nm to 700 nm is 50% or more in a state where the adhesive layer 60 and the resin base material layer 71 are measured together. It is desirable that the layer thickness of the resin base material layer 71 is set to 7 μm or more and 250 μm or less. This is because if the layer thickness of the resin base material layer 71 is less than 7 μm, lamination processing is difficult. Further, this is also because if the layer thickness of the resin base material layer 71 is larger than 250 μm, the bulk and weight become too large and the cost increases. Further, it is preferable that the refractive index of the resin base material layer 71 is 1.45 or more and 1.55 or less.

The surface layer 72 may be a layer having both an antireflection function and a hard coat function. It is desirable that the surface layer 72 has a regular reflectance of 1.5% or less for light having a wavelength of 535 nm in order to prevent deterioration of the visibility of the mark 2 due to reflection from the surface of the marker 1. For example, when a ring-shaped illumination or the like arranged so as to surround the lens of a camera is used for observing the marker 1, the illumination itself may be reflected from the surface of the marker 1 and observed. In such a case, the antireflection function of the surface layer 72 prevents or suppresses surface reflection, so that the contour of the mark 2 can be recognized more clearly, and highly accurate detection can be performed. Further, as a hard coat function of the surface layer 72, it is desirable that the pencil hardness is equal to 1H or higher. The surface layer 72 can be configured by using, for example, sol-gel, siloxane, polysilazane, or the like. Examples of a specific method for antireflection function include antireflection (AR) and antiglare (AG) method, but the AR method is preferable for recognition of the mark 2 under a condition that strong light rays such as sunlight are not specularly reflected. Under a condition that strong light rays such as sunlight may be specularly reflected, the AG method is preferable for the recognition of the mark 2. The AR method can be created by a known method such as multi-layer thin film interference or a moth-eye method, and the AG method can be created by a known method such as a method of kneading, into a film, light-diffusing particles for making the surface of the film to have asperities, or coating the particles on the surface of the film.

Further, it is desirable as a characteristic of the combination of the adhesive layer 60 and the protective layer 70 that the total light transmittance is 85% or more. This is because if the total light transmittance is less than 85%, a sufficient light amount cannot be secured. Further, it is desirable as a characteristic of the combination of the adhesive layer 60 and the protective layer 70 that the haze value is 30% or more, more preferably 40% or more, and further preferably 70% or more. This is because if the haze value is lower than 70%, an antireflection effect starts to deteriorate, when the haze value is equal to or less than 40%, the effect further deteriorates, and when the haze value is equal to or less than 30%, the effect deteriorates remarkably. On the other hand, it is desirable that the haze value is equal to or less than 95%. This is because if the haze value is higher than 95%, the image of an observed mark is blurred.

Figure 3:
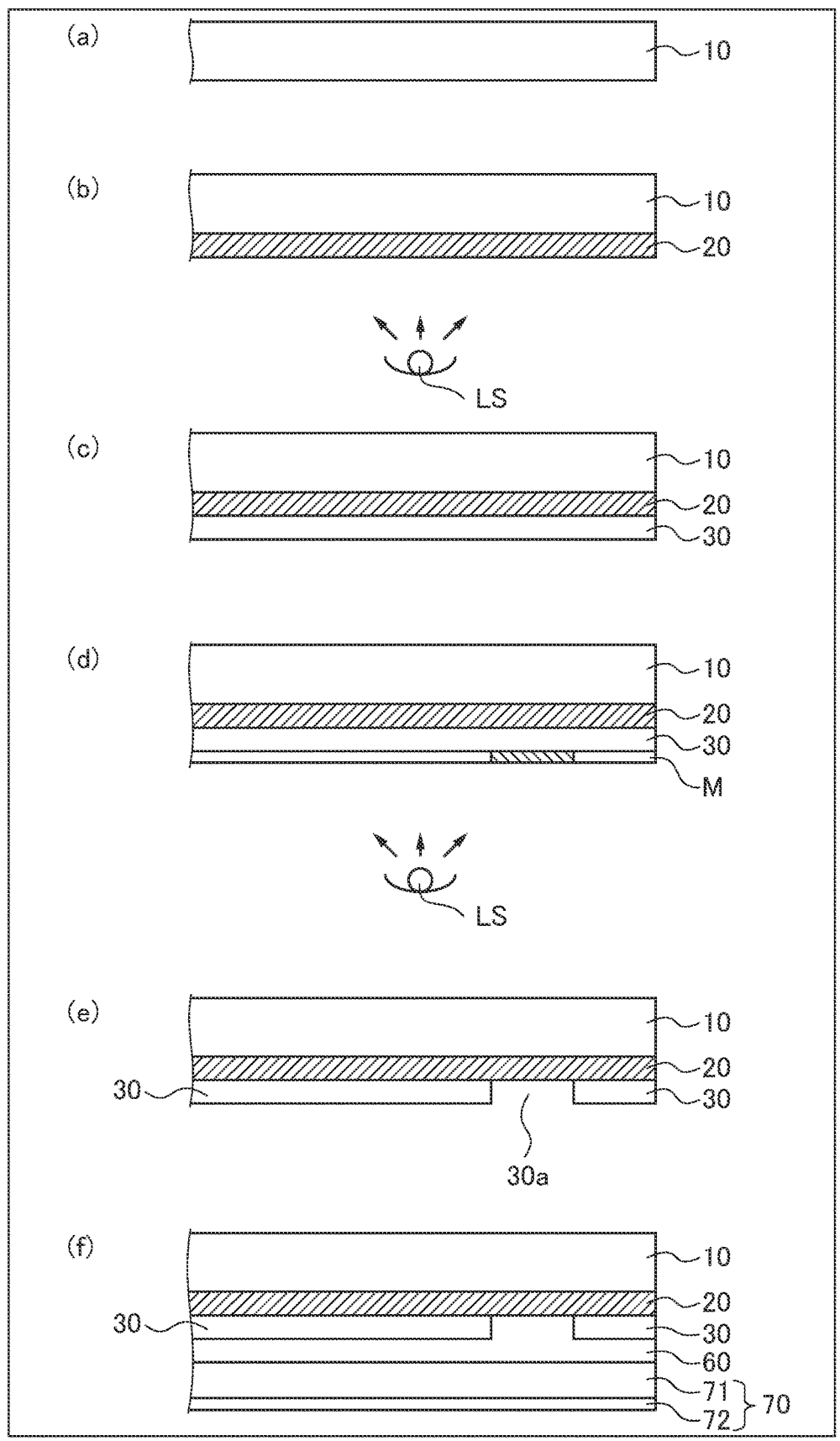
FIG. 3 is a diagram showing a manufacturing process of the marker 1.

Next, a method for manufacturing the marker 1 of the present embodiment will be described. FIG. 3 is a diagram showing a manufacturing process of the marker 1. FIG. 3 shows the process with the front and back (the top and bottom) being reversed with respect to that of FIG. 2. First, a glass plate is prepared and used as the base material layer 10 (FIG. 3) (a). Next, a black-colored resist material which will serve as the material of the first layer 20 is coated onto one surface of the base material layer 10 (first layer forming step), prebaked, and solidified. Thereafter, this material is exposed by a light source LS (first developing step), and further developed and post-baked (first baking step) to stabilize the first layer 20 (FIG. 3 (b)).

Next, a white-colored resist material which will serve as the material of the second layer 30 is coated onto the first layer 20 (second layer forming step), prebaked, and solidified (FIG. 3 (c)). Next, a mask M is brought into close contact with the solidified second layer 30 to expose the second layer 30 to light via a mark pattern (second exposing step) (FIG. 3 (d)). A mask pattern in which light is transmitted through portions other than the portion corresponding to the mark 2 and light is shielded by the portion corresponding to the mark 2 is formed on the mask M in advance.

Next, the second layer 30 which has been exposed to light is developed to remove the resist material at the position corresponding to the mark 2, thereby forming an opening portion 30a (second developing step) (FIG. 3 (e)). After the development, the second layer 30 is post-baked (second baking step). Finally, a separately prepared film-shaped or sheet-shaped protective layer 70 is attached onto the second layer 30 through an adhesive layer 60 to complete the marker 1 (FIG. 3 (f)).

Since the marker 1 of the present embodiment uses a resist material, the contour shape of the mark 2 is created with extremely high accuracy, and the observed shape of the mark 2 enables more accurate control. In order to facilitate the understanding of this fact, the contour shape of the marker 1 of the present embodiment and a comparative example are actually prepared, and a comparison result therebetween is shown below. In the comparative example, the shape of the mark 2 was printed on paper by using a laser printer.

Figure 4:
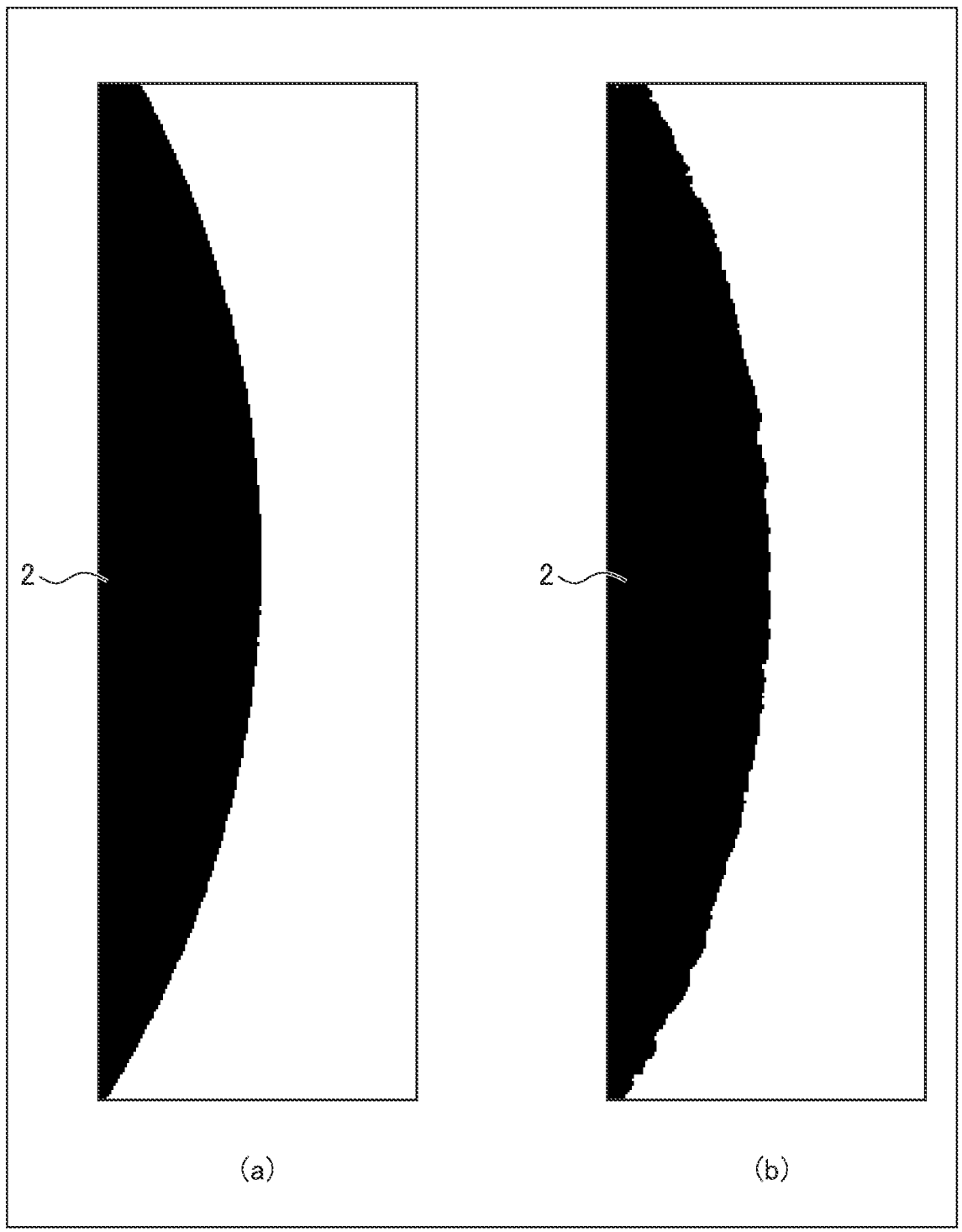
FIG. 4 is a partially enlarged view showing results obtained by photographing the marks 2 of the present embodiment and a comparative example.

FIG. 4 is a partially enlarged view showing results obtained by photographing the marks 2 of the present embodiment and the comparative example. In FIG. 4 (a) shows the present embodiment, and of FIG. 4 (b) shows the comparative example. Note that FIG. 4 shows binarized values with an intermediate value between black and white set as a threshold value. A digital microscope VHX-5500 (1/1.8 type CMOS image sensor, effective pixel 1600 (H)× 1200 (V)) manufactured by KEYENCE CORPORATION was used for photographing the marks 2. The distance between the mark 2 and the tip of the lens under photographing was set to 15 mm.

As shown in FIG. 4, the marker 1 of the present embodiment is represented by a curve (arc) in which the contour shape of a peripheral edge portion of the mark 2 is very smooth. On the other hand, in the comparative example, although it looks like a circle when viewed from a distance, the contour shape is greatly collapsed from the arc in large view.

In FIG. 4, the photographing results are not represented because they are binarized. However, with respect to the actual photographing results, in the comparative example, existence of an intermediate gradation is remarkable instead of the two gradations of black and white. Therefore, especially in the comparative example, it is considered that the shape to be grasped as the outer shape of the mark 2 changes depending on a photographing condition (observation condition) and a method of identifying the boundary between black and white (threshold value), which is not desirable. In order to facilitate the comparison with the case of the present embodiment in this point, the change in light intensity with respect to the position change at the boundary between black and white is graphed based on photographing data.

Figure 5:
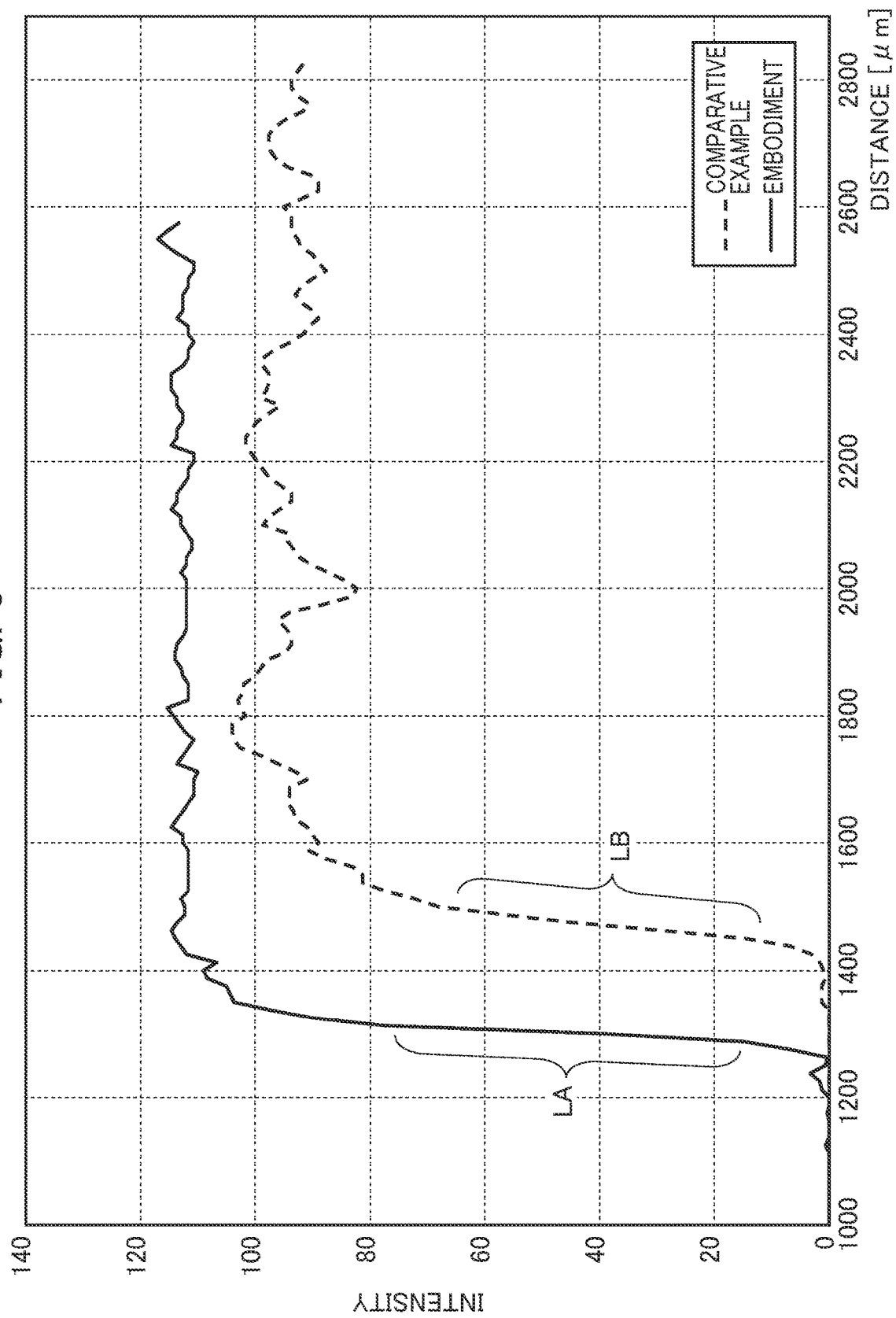
FIG. 5 is a diagram showing the change in light intensity with respect to the change in position at the boundary between black of a first layer 20 and white of a second layer 30.

FIG. 5 is a diagram showing the change in light intensity with respect to the change in position at the boundary between the black of the first layer 20 and the white of the second layer 30. In FIG. 5, a lower side in intensity on the vertical axis appears to be a black side, and a higher side in intensity appears to be a white side. Further, although the horizontal axis corresponds to the pixel of the photographing data, the absolute value itself thereof has no meaning because a reference position is shifted between two polygonal line data so that the two polygonal line data do not overlap each other. The change in the pixel value on the horizontal axis corresponds to the position change, and 100 pixels corresponds to 1 mm. An embodiment and a comparative example in FIG. 5 are the same as the embodiment and the comparative example shown in FIG. 4, respectively.

As described above, it is desirable that the contrast value between the color of the first layer 20 (first color) and the color of the second layer 30 (second color) is equal to or more than 0.26. The reason why it is desirable that the contrast value is equal to or more than 0.26 resides in that if the contrast value is less than 0.26, the automatic detection of the mark 2 using the camera is considered to be difficult. Here, the contrast value=(Imax−Imin)/(Imax+Imin) when the maximum value of the light intensity is represented by Imax and the minimum value thereof is represented by Imin. In the example shown in FIG. 5, the contrast value of the present embodiment was equal to 0.98, and the contrast value of the comparative example was equal to 0.98, so that no significant difference could be confirmed between both the contrast values.

Further, as described above, it is desirable that the blur value observed between the color of the first layer 20 (first color) and the color of the second layer 30 (second color) is equal to or more than 1.0. Especially when the mark is used for high-accuracy control, it is not desirable that the boundary of the mark is ambiguous. Therefore, it is desirable that the change in intensity at the boundary portion between the black side and the white side is like a rectangular wave or the change is steep. The changes in intensity at the boundary portion between the black side and the white side were quantified from the data of FIG. 5, and compared with each other. Specifically, the data in ranges shown as LA and LB in the polygonal lines in FIG. 5 were quantified based on gradients thereof. Here, the ranges LA and LB are determined so that the ranges LA and LB can be sufficiently linearly approximated. In other words, approximation straight lines are determined for ranges in which the change in intensity is great, and ranges in which the measurement data do not deviate are determined as the ranges LA and LB. In the above ranges LA and LB, (the change amount in intensity)/(the change amount in pixel) was determined as the gradient value (blur value) of the change in intensity. As a result, in the present embodiment, the gradient value (blur value) of the change in intensity was equal to 1.29. On the other hand, in the comparative example, the gradient value (blur value) of the change in intensity was equal to 0.87. As described above, a clear difference is observed between both the embodiment and the comparative example, and the configuration of the present embodiment is a desirable one closer to the ideal.

As described above, according to the present embodiment, photolithography is used, so that it is possible to easily perform manufacturing without requiring any high-accuracy machining, and it is possible to obtain a high-accuracy marker. Further, with respect to the marker 1 of the present embodiment, the thickness of the second layer 30 can be made very small, and it can be suppressed that the shape of the mark 2 is observed as being distorted even when the mark 2 is observed in a diagonal direction, so that more accurate position detection is possible.

Second Embodiment

Figure 6:
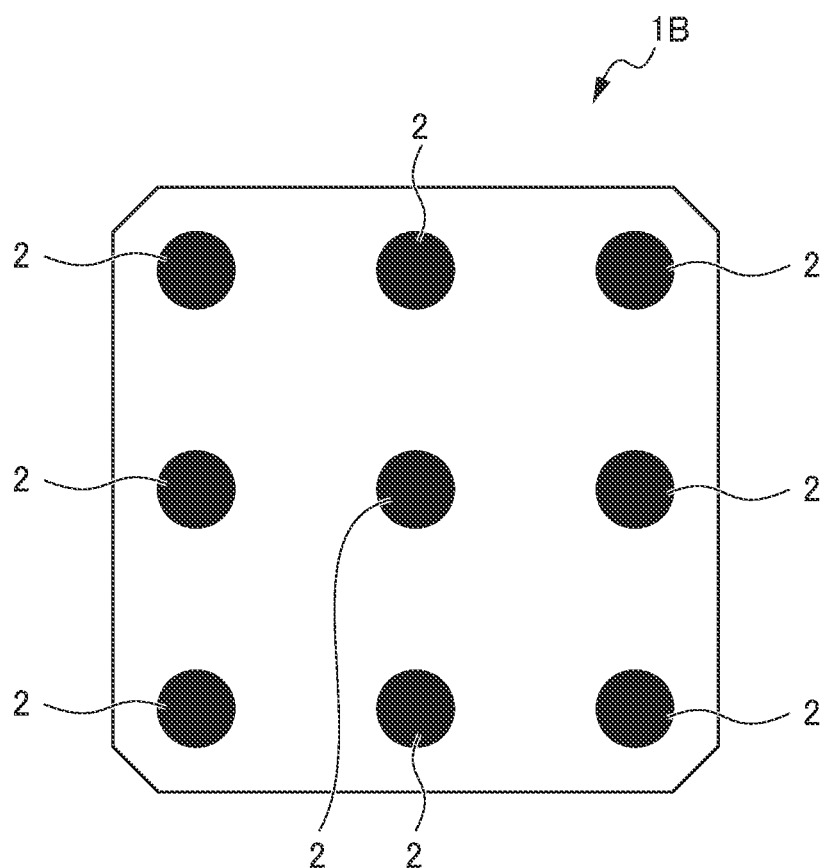
FIG. 6 is a diagram showing a marker 1B of a second embodiment.

FIG. 6 is a diagram showing a marker 1B of a second embodiment. The marker 1B of the second embodiment has the same form as the marker 1 of the first embodiment except that a larger number of marks 2 are arranged. Therefore, the same reference numerals are given to portions that perform the same functions as those of the first embodiment described above, and duplicative description thereon will be omitted as appropriate.

In the marker 1B of the second embodiment, a larger number of marks 2 are arranged as compared with the first embodiment. Specifically, nine marks 2 are arranged on the marker 1B to be spaced from one another at intervals in a grid pattern. As described above, it is desirable that at least three marks 2 are arranged. This is because, for example, if the positions of the centers of gravity of the marks 2 are calculated at three points from an observation result of the marks 2, the relative position and inclination between the observation position (camera or the like) and the marker 1 can be accurately detected. Further, if the number of marks 2 is larger than 3, for example, when some marks 2 are unclearly observed due to some kind of obstacle, the position detection can be performed from an observation result of the remaining marks 2. By using a plurality of marks 2, the accuracy of position detection can be improved.

In the second embodiment, the number of marks 2 is set to 9, which is significantly increased as compared with the first embodiment. As a result, in addition to the above effect, the following effect can be expected. For example, even when there are many marks 2 that are not properly photographed (observed) because half or more of the areas of markers 1B cannot be properly photographed (observed), it is possible to enhance the possibility that the position detection can be appropriately performed by photographing (observing) the remaining marks 2. A situation in which half or more of the areas of the markers 1B cannot be properly photographed (observed) includes, for example, a situation in which sunlight directly hits half or more of the areas of the markers 1B and no sunlight hits the remaining areas. In such a case, if the exposure (gain) is properly adjusted for one side, the other side would be overexposed or underexposed. Further, this can also be illustrated in a case where another object physically overlaps a part of the optical axis of photography and half or more of the areas of the markers 1B cannot be photographed (observed).

Assuming a substantially square marker as shown in FIG. 6, it is desirable that the number of marks 2 is set to nine or more because it is easy to arrange the marks 2 evenly. The number of marks 2 may be further increased, and the arrangement thereof may be not limited to uniform arrangement, but may be so-called a random arrangement in which the marks 2 are randomly arranged. Even in the case of random arrangement, the position detection can be easily performed if the arrangement data of the marks 2 in the marker 1B is obtained. Even in a case where the relationship between the marker 1B and the photographing position (observation position) is shifted by a half rotation, the relative positional relationship therebetween can be accurately grasped by the random arrangement.

As described above, according to the second embodiment, the marker 1B includes nine or more marks 2. Therefore, the position detection can be appropriately performed even under a stricter photographing condition (observation condition).

Third Embodiment

Figure 7:
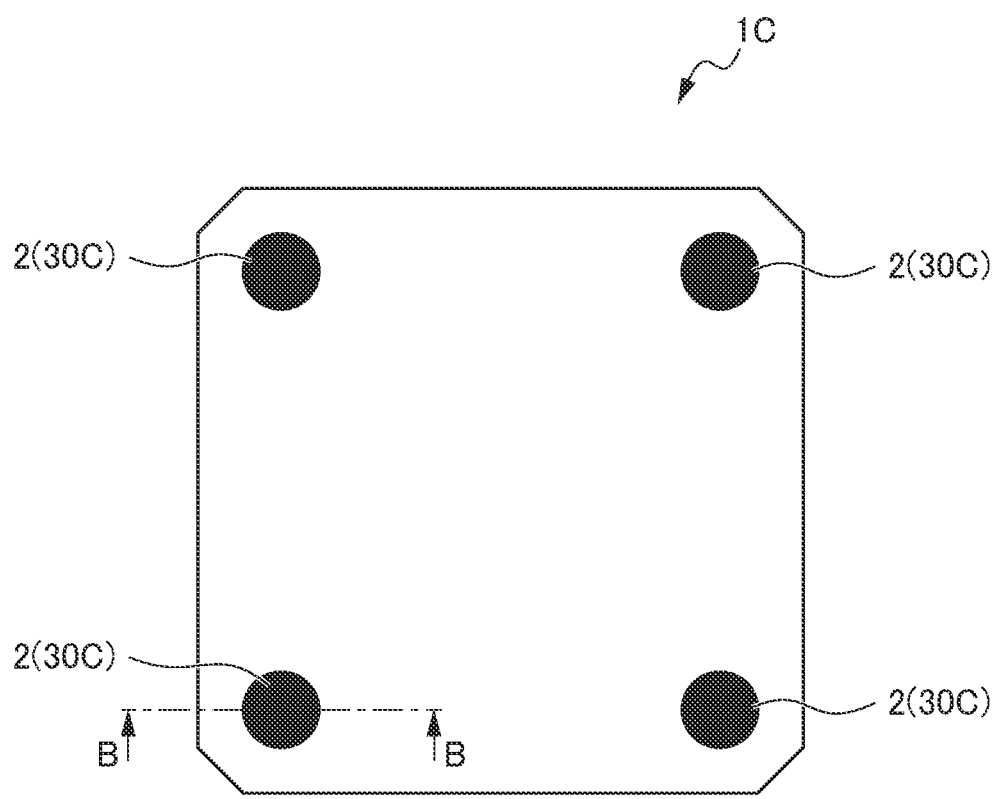
FIG. 7 is a diagram showing a marker 1C of a third embodiment.
Figure 8:
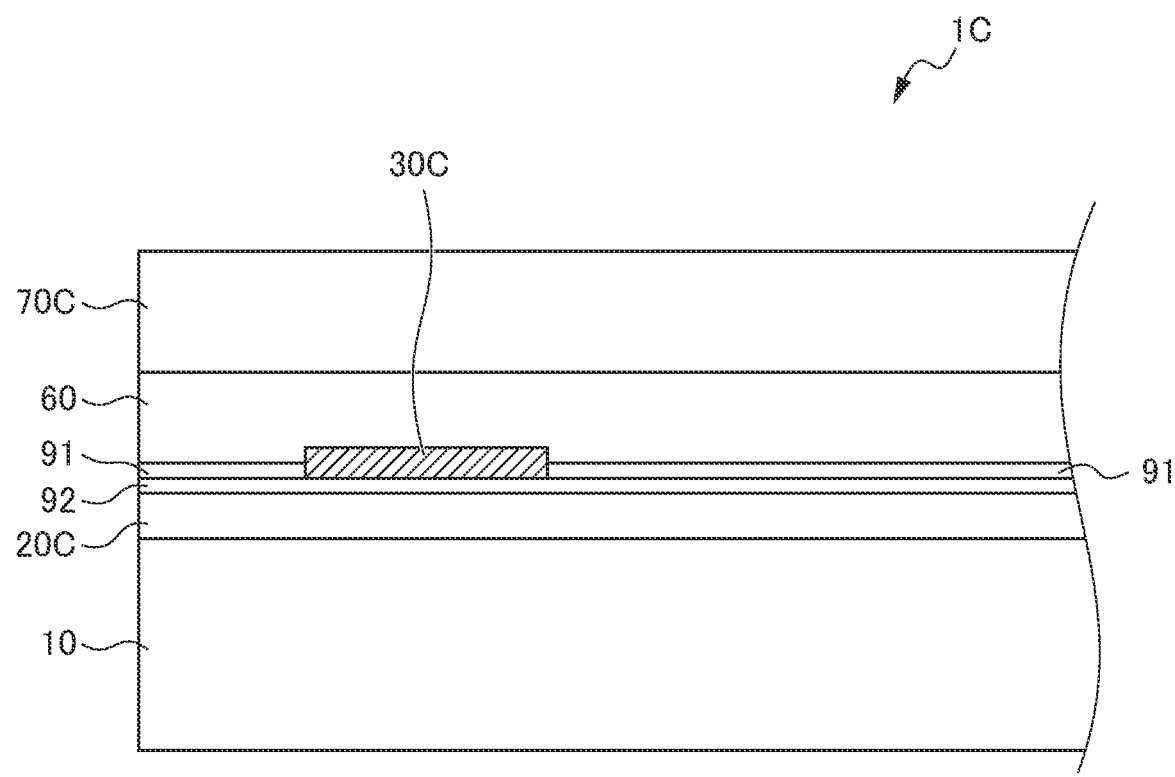
FIG. 8 is a cross-sectional view of the marker which is cut at the position of arrows B-B in FIG. 7.

FIG. 7 is a diagram showing a marker 1C of a third embodiment. FIG. 8 is a cross-sectional view of a marker which is cut at the position of an arrow B-B in FIG. 7. The marker 1C of the third embodiment has the same form as the marker 1 of the first embodiment except that an observed form of the mark is set to the same as that of the first embodiment, but the first layer 20C is set to white color and the second layer 30C on the observation side is set to black color, a flattening layer 91 and an intermediate layer 92 are provided, and the form of the protective layer 70C is different. Therefore, the same reference numerals are given to portions that perform the same functions as those of the first embodiment described above, and duplicative description thereon will be omitted as appropriate.

The marker 1C of the third embodiment is configured in a thin plate-like shape by laminating a base material layer 10, a first layer 20C, an intermediate layer 92, a second layer 30C, an adhesive layer 60, and a protective layer 70C in this order from the back surface side thereof. Further, a flattening layer 91 is provided in a peripheral region where the second layer 30C is not provided.

The first layer 20C is formed of a resist material colored white (first color), and is laminated on the entire surface of the base material layer 10. In the present embodiment, the base material layer 10 is made of non-alkali glass having a thickness of 700 μm. In the present embodiment, since the first layer 20C is formed of the resist material, the surface of the first layer 20C can be formed very smoothly, which makes the first layer 20c desirable as a base for forming the second layer 30C described later. Further, since an alignment mark (not shown) when the second layer is formed can be formed on the outer peripheral portion of the first layer, the dimensional accuracy can be improved. It is desirable that the layer thickness of the first layer 20C (in the case of white) is set to 3 μm or more and 100 μm or less. This is because if the layer thickness of the first layer 20C is smaller than 3 μm, the diffuse reflectance is insufficient, the contrast is lowered, and the visibility of the mark 2 (easiness of detection by automatic recognition) is lowered. Further, this is also because if the layer thickness of the first layer 20C is larger than 100 μm, it is difficult to make the film thickness uniform. In the present embodiment, the layer thickness of the first layer 20C is set to 15 μm.

The second layer 30C is formed of a resist material colored black (second color). A film of the second layer 30C is partially formed by photolithography processing described later, thereby providing four sites where the first layer 20C is concealed by the film of the second layer 30c. The region of the second layer 30C is observably configured as a mark 2 having an independent shape.

It is desirable that the layer thickness of the second layer 30C is 1 μm or more and 5 μm or less. This is because if the layer thickness of the second layer 30C is 1 μm or less, it cannot be uniformly formed, and if the layer thickness is 5 μm or more, the curing reactivity of the resin by ultraviolet rays is insufficient. In the third embodiment, the second layer 30C, which is colored black, has a high concealing capacity for concealing the base. Therefore, since the white color of the first layer 20C can be sufficiently concealed without thickening the second layer 30C, it is possible to make the layer thickness as small as described above. By forming the second layer 30C thinly, it is possible to suppress deterioration in measurement accuracy due to the observation of the end surface of the second layer 30C, and it is possible to improve the measurement accuracy. In the present embodiment, the layer thickness of the second layer 30C is set to 1 μm.

In the marker 1C of the present embodiment, the intermediate layer 92 is laminated between the first layer 20C and the second layer 30C. The intermediate layer 92 is provided in order to cope with a case where the bonding force between the first layer 20C and the second layer 30C is not sufficiently obtained. When the second layer 30C is directly laminated on the first layer 20C, the second layer 30C may be repelled by the first layer 20C. In such a case, the second layer 30C can be properly laminated by laminating the intermediate layer 92 which is difficult to be repelled. Therefore, the intermediate layer 92 may be provided as needed, and may be omitted as in the first embodiment. The intermediate layer 92 can be formed by using, for example, an acrylic resin, and a layer thickness of about 1 μm to 2 μm is sufficient. In the present embodiment, acrylic resin having a layer thickness of 2 μm is formed.

Since the first layer 20 or 20C is laminated on the base material layer 10 and the second layer 30 or 30C is further laminated on the first layer 20 or 20C, a step occurs in the patterned second layer 30 or 30C. In the case of the second layer 30 of the first embodiment, the cross-sectional shape of the portion corresponding to the mark 2 is concave, and in the case of the second layer 30C of the third embodiment, the cross-sectional shape of the portion corresponding to the mark 2 is convex.

Therefore, when the protective layer 70 described later is stuck, the above-mentioned step is filled with the adhesive layer 60 to some extent. However, if the step is large, it cannot be filled with the adhesive layer, and there is a risk that an air layer (void) intrudes in the vicinity of the step. The refractive index of the air layer is 1, which is clearly lower than the refractive index of 1.4 to 1.6 of the base material, etc. Therefore, reflection of light occurs at the interface of the substance, and it causes ambient light when the mark 2 is detected by the camera, so that the detection accuracy is significantly deteriorated. Therefore, in order to suppress the occurrence of the air layer, the film thicknesses of the second layers 30 and 30C are equal to 5 μm or less, more preferably 3 μm or less, and further preferably 2 μm or less.

However, as in the first embodiment described above, when the second layer 30 is colored white, the concealing capacity for concealing the base is inferior to that of black color. Therefore, it may not be desirable that the thickness is made smaller, and the above-mentioned step may be large. Therefore, if the above-mentioned step cannot be set to 5 μm or less, a flattening layer 91 is provided in a region which is around the second layers 30 and 30C and in which the second layers 30 and 30C are not provided, so that it is possible to prevent the air layer from intruding. It is preferable that the flattening layer 91 is formed of a transparent material which enables identification of the mark 2, and known materials such as acrylic materials and epoxy materials can be used. The third embodiment illustrates a form in which the flattening layer 91 is provided to reduce the step. By providing the flattening layer 91, the step between the second layer 30C and the flattening layer 91 can be further reduced. In the third embodiment, the flattening layer 91 may be omitted because the second layer 30C is black, has a high concealing capacity, and can be formed thinly.

The protective layer 70C is a layer for protecting the first layer 20C and the second layer 30C, and is stuck onto the second layer 30C and the flattening layer 91 via the adhesive layer 60. In the third embodiment, the protective layer 70C illustrates an example in which it is formed by a single layer, and specifically, a matte film which is formed of a vinyl chloride resin at 70 μm and has a haze value of 75 is used.

Figure 9:
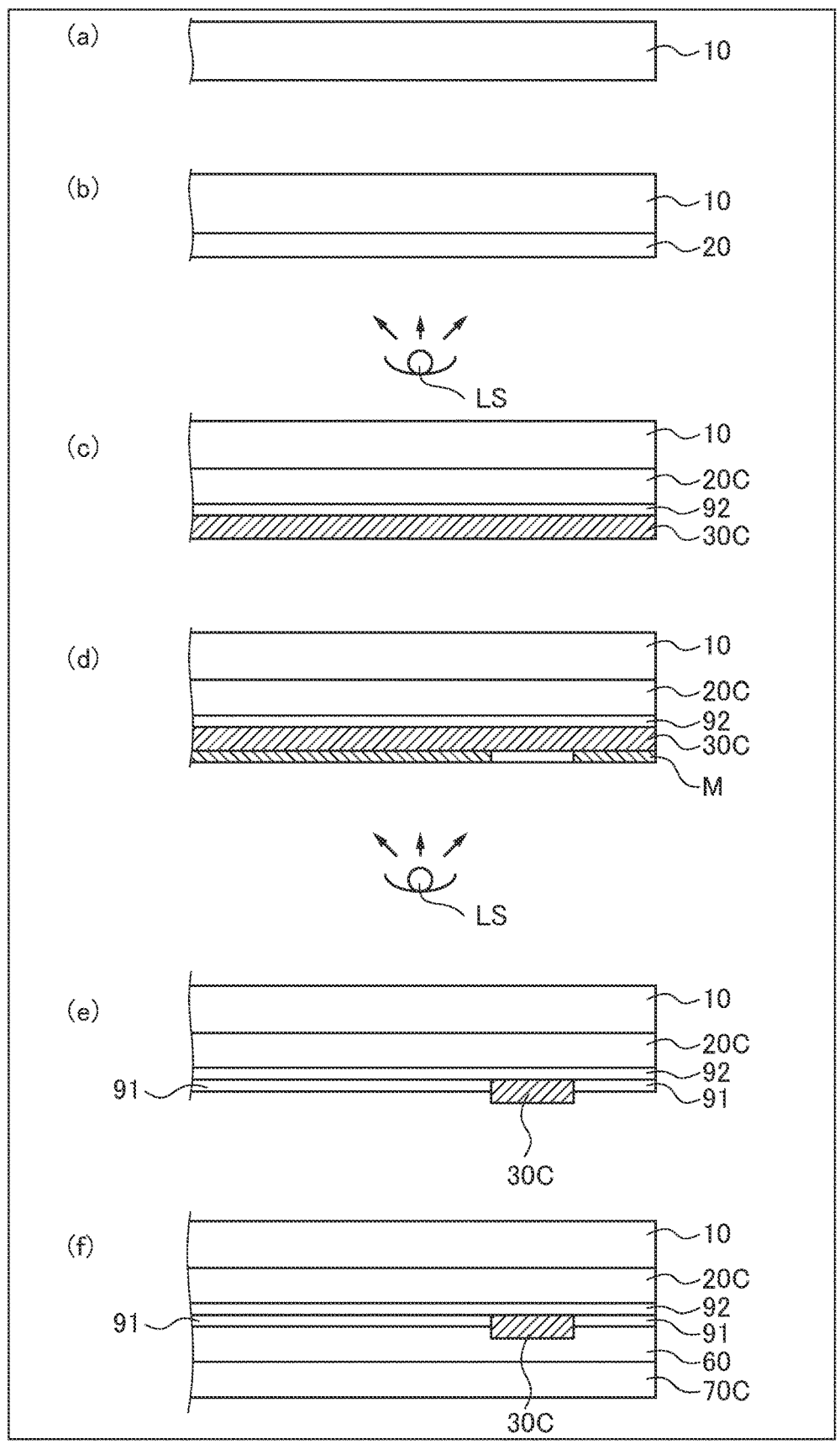
FIG. 9 is a diagram showing a manufacturing process of the marker 1C in which the front and back (the top and bottom) are reversed with respect to that of FIG. 8.

Next, a method for manufacturing the marker 1C of the present embodiment will be described. FIG. 9 is a diagram showing a manufacturing process of the marker 1C. Note that FIG. 9 shows the front and back (top and bottom) which are reversed with respect to that in FIG. 8. First, a glass plate is prepared and used as the base material layer 10 (FIG. 9 (*a*)). Next, a white-colored resist material which serves as the material of the first layer 20 is coated onto one surface of the base material layer 10 (first layer forming step), prebaked, and dried, and thereafter, this resultant material is exposed by a light source LS (first developing step), further developed and post-baked (first baking step) to stabilize the first layer 20C (FIG. 9 (*b*)).

Next, the intermediate layer 92 is formed on the first layer 20C, and a black-colored resist material serving as a material for the second layer 30C is further coated onto the intermediate layer 92 (second layer forming step), pre-baked and dried (FIG. 9 (*c*)). Next, the mask M is brought into close contact with the dried second layer 30C to expose the second layer 30C to light via the mark pattern (second exposure step) (FIG. 9 (*d*)). A mask pattern in which light is transmitted through the position corresponding to the mark 2 and light is shielded by the other positions is formed on the mask M in advance.

Next, the second layer 30C which has been exposed to light is developed to remove the resist material at the portion other than the portion corresponding to the mark 2 (around the mark 2), thereby forming an opening portion 30*a* (second developing step) (FIG. 9 (*e*)). After the development, the second layer 30C is post-baked (second baking step). Further, the flattening layer 91 is provided in a region where the second layer 30C is not formed (a region where the resist material is removed). Finally, the separately prepared film-shaped or sheet-shaped protective layer 70 is stuck onto the second layer 30C and the flattening layer 91 by the adhesive layer 60 to complete the marker 1C (FIG. 9 (*f*)).

Figure 10:
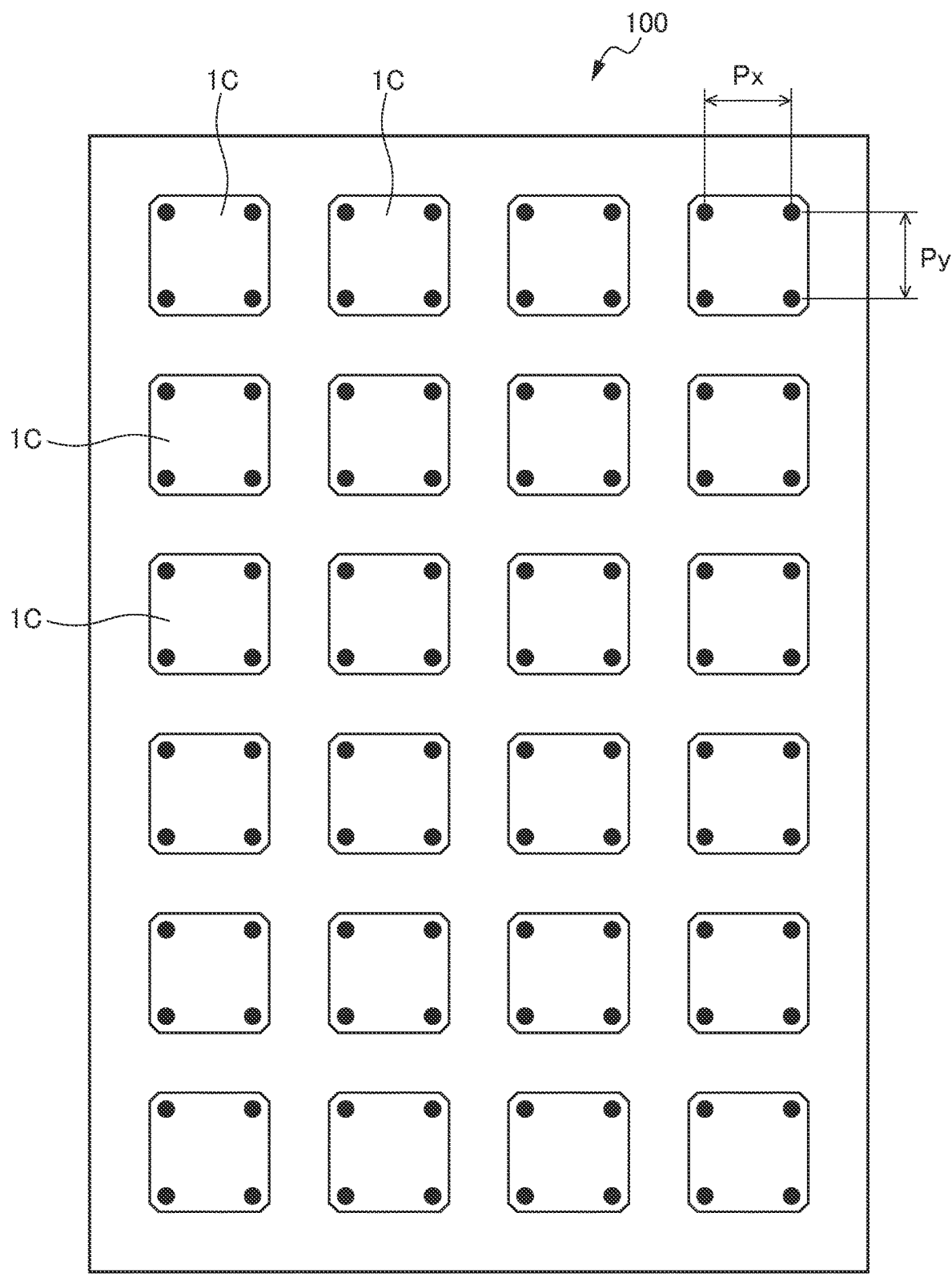
FIG. 10 is a diagram showing a marker multi-imposition body 100.

FIG. 10 is a diagram showing a marker multi-imposition body 100. In the manufacturing of the marker 1C described with reference to FIG. 9, a plurality of markers 1C are manufactured as a marker multi-imposition body 100 in which a plurality of markers 1 are arranged side by side, that is, a plurality of markers 1C are arranged in a multi-imposition style. Markers 1C are obtained by cutting out and individualizing individual markers 1C from this marker multi-imposition body 100. In the above manufacturing process, the resist material is used and the exposure process is used, so that highly accurate manufacturing is possible. In other words, the dimensional variation in the external shapes of the marks 2 on one multi-imposition body 100 and the dimensional variation in the arrangement pitches between the marks 2 in each marker 1C can be set to ±10 μm or less. More specifically, in the present embodiment, the dimensional variation in the external shapes of the marks 2 on one multi-imposition body 100 and the dimensional variation in the arrangement pitches between the marks 2 in each marker 1C are each set to ±1 μm or less. In the present embodiment, the external shape of the mark 2 corresponds to the diameter of the mark 2, and the arrangement pitches between the marks 2 in each marker 1C corresponds to Px and Py shown in FIG. 10.

As described above, according to the third embodiment, the second layer 30C provided on the observation side is colored black, and the first layer 20C is colored white. As a result, the second layer 30C has a higher concealing capacity for concealing the base, so that the layer thickness of the second layer 30C can be made smaller than that of the first embodiment. Therefore, when observing the mark 2 configured by the second layer 30C, the influence on the measurement accuracy by the observation of the side end surface of the second layer 30C can be suppressed as much as possible, and the measurement with higher accuracy can be performed. Further, according to the third embodiment, by providing the flattening layer 91, it is possible to suppress the occurrence of voids caused by the lamination of the adhesive layer 60, and it is possible to suppress the deterioration of the measurement accuracy.

With respect to the markers 1, 1B and 1C of the first to third embodiments described above, the protective layer 70, 70C is laminated and arranged via the adhesive layer 60. With this configuration, the markers 1, 1B and 1C have very high reliability. For example, when some object collides with the marker 1, 1B, 1C during use, it is considered that the base material layer 10 is cracked because the base material layer 10 is a glass plate. However, since the protective layer 70, 70C is laminated via the adhesive layer 60, the protective layer 70, 70C functions as a shatter-proof layer to prevent fragments of the base material layer 10 from scattering. Even when the base material layer 10 is cracked, the first layers 20, 20C and the second layer 30, 30C can maintain the function as the marker without being damaged.

This is because since the bonding force of the first layers 20 and 20C and the second layers 30 and 30C to the base material layer 10 is weaker than the bonding force thereof to the adhesive layer 60, it is guessed that the first layers 20 and 20C and the second layer 30 and 30C follow the adhesive layer 60, whereby they are prevented from being damaged. Therefore, it is desirable that the bonding force of the first layers 20 and 20C and the second layers 30 and 30C to the base material layer 10 is weaker than the bonding force of the first layers 20 and 20C and the second layers 30 and 30C to the adhesive layer 60. It has been verified by a drop test using an actual product that the first layers 20 and 20C and the second layers 30 and 30C are not damaged even if the base material layer 10 is cracked.

Figure 11:
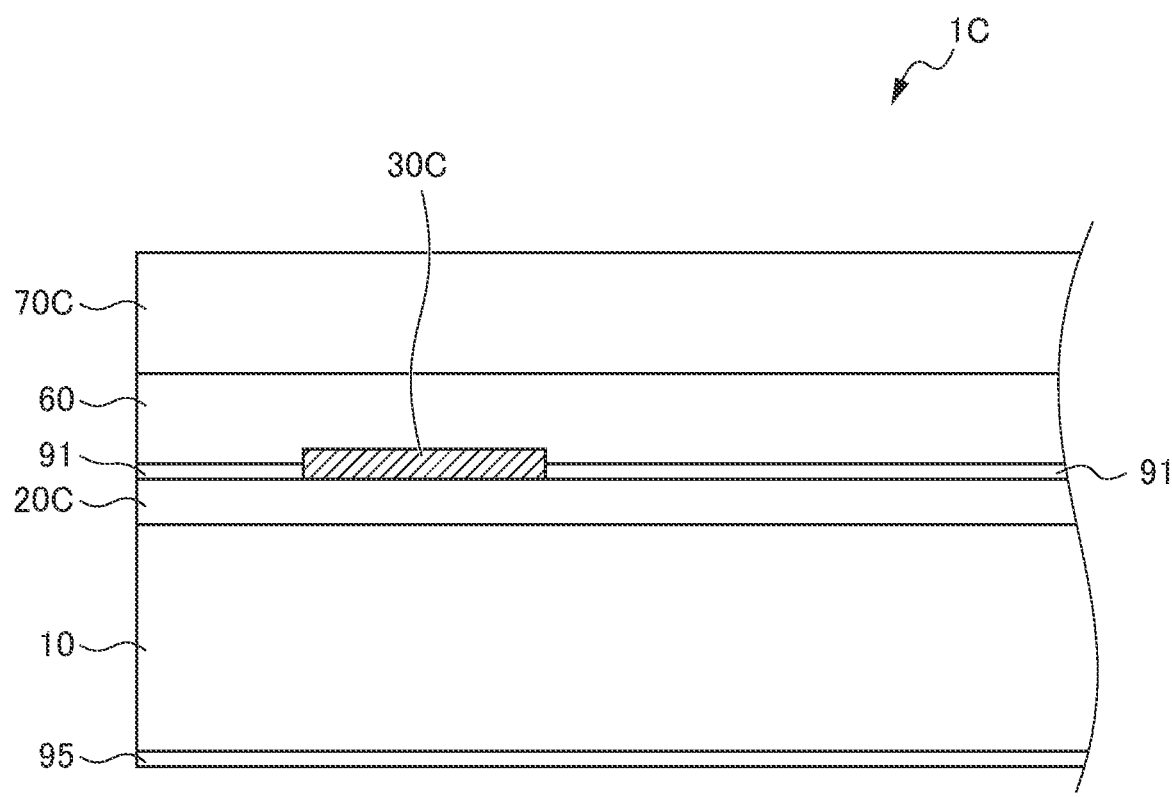
FIG. 11 is a diagram showing a form in which an electrode layer 95 is provided.

Further, as described above, even if the base material layer 10 is cracked, the cracks in the base material layer 10 cannot be confirmed even when viewed from the observation side. Therefore, a sensor for detecting damage may be provided on the back side of the base material layer 10. FIG. 11 is a diagram showing a form in which the electrode layer 95 is provided. The electrode layer 95 can be formed on substantially the entire surface of the back side of the base material layer 10, and is allowed to function as a sensor for detecting damage. The electrode layer 95 may be formed of, for example, ITO, copper foil, aluminum foil, or the like, but when the base material layer 10 is damaged, it is necessary that the electrode layer 95 is damaged together with the base material layer 10. If the electrode layer 95 is damaged and the electric resistance value thereof changes, damage to the base material layer 10 can be detected by electrically monitoring the electrode layer 95. Further, by forming the electrode layer 95 with a material such as a metal having high light reflectivity, it is possible to improve the visibility of the mark 2 at a dark place by reflecting external light and detection light by the electrode layer 95. When the electrode layer 95 is provided, the protective layer 70C may be omitted.

Fourth Embodiment

Figure 17:
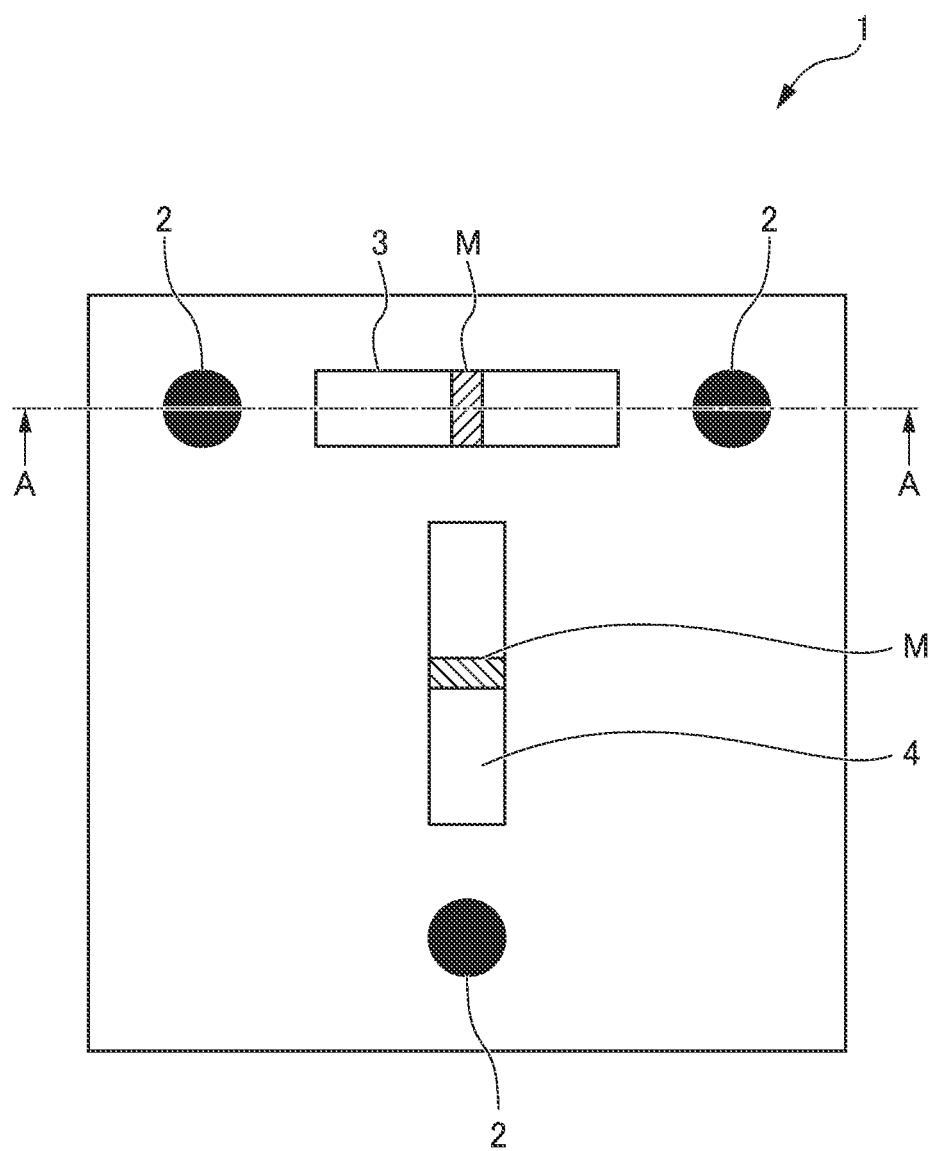
FIG. 17 is a diagram showing a fourth embodiment of the marker according to the present invention.

FIG. 17 is a diagram showing a fourth embodiment of the marker according to the present invention. The following figures including FIG. 17 are schematic diagrams, and the sizes and shapes of respective parts are presented by being exaggerated or omitted as appropriate to facilitate understanding thereof. Further, the following description will be made while presenting specific numerical values, shapes, materials, and the like, but these can be changed as appropriate. In the present specification, terms such as plate, sheet, and film are used. The terms of plate, sheet, and film are generally used in the decreasing order of thickness, and these terms are also used in the same way in the present specification. However, such a manner of use has no technical meaning, and thus these terms may be replaced as appropriate. Further, in the present invention, a "transparent" substance means a substance which transmits therethrough light having at least a wavelength to be used. For example, if a substance transmits infrared rays although it does not transmit visible light, the substance shall be treated as a transparent substance when used for applications using infrared rays. It should be noted that specific numerical values specified in the present specification and the claims should be treated as including a general error range. In other words, a difference of about ±10% is substantially the same, and a value set in a range slightly beyond the numerical range of the present invention should be interpreted as being substantially within the numerical range of the present invention.

As shown in FIG. 17, a marker 1 is configured like a plate having a substantially square shape when viewed from the normal direction of a surface on which a protective layer 70 described later is provided, and includes marks 2 and moire display regions 3 and 4. In the present embodiment, the marker 1 is formed so that the shape thereof when viewed from the surface side is a square shape of 60 mm×60 mm.

The marker 1 detects the relative positional relationship between the photographing position and the marker 1 according to how the mark 2 is observed (hereinafter, also simply referred to as position detection), and further, it is possible to perform position detection with higher accuracy according to how moire displayed in the moire display regions 3 and 4 is observed. With respect to the marker 1, a surface shown in FIG. 17 is a front side (front surface) to be observed, an opposite side thereto is a back side (back surface), and in FIG. 18 described later, a side on which the protective layer 70 is provided is the front side (front surface) to be observed.

The marks 2 are arranged at two places near two upper corners and at one place near the lower center in the right-and-left direction in FIG. 17, totally three marks are arranged to be spaced from one another. The mark 2 is configured to be observable as a mark having an independent shape. Note that a mark having an independent shape means that a plurality of marks are not connected and each of the marks has an individually recognizable form. It is desirable that at least three marks 2 are arranged. This is because, for example, if the positions of the centers of gravity of the marks 2 are calculated at three points from an observation result of the marks 2, the relative position and inclination between the observation position (camera or the like) and the marker 1 can be accurately detected. Further, if the number of marks 2 is larger than 3, for example, when some marks 2 are unclearly observed due to some kind of obstacle, the position detection can be performed from an observation result of the remaining marks 2. By using a plurality of marks 2, the accuracy of position detection can be improved. In the present embodiment, the mark 2 is configured in a circular shape. However, the mark 2 is not limited to the circular shape, and it may be formed to in a polygonal shape such as a triangle or a quadrangle, or another shape.

The moire display regions 3 and 4 display the moire M. FIG. 17 shows a state in which the moires M are displayed in the centers of the moire display regions 3 and 4 in both the moire display regions 3 and 4. The position where the moire M is displayed shifts when the relative position (angle) between the marker 1 and the observation position changes. In the present embodiment, each of the moire display regions 3 and 4 has a length of 30 mm in the longitudinal direction, and the display position of the moire M shifts along the longitudinal direction. The moire display region 3 and the moire display region 4 are arranged so that their longitudinal directions are orthogonal to each other. Since the display regions 3 and 4 have the same configuration except that the arrangement directions thereof are different from each other, the display region 3 will be described below.

Figure 18:
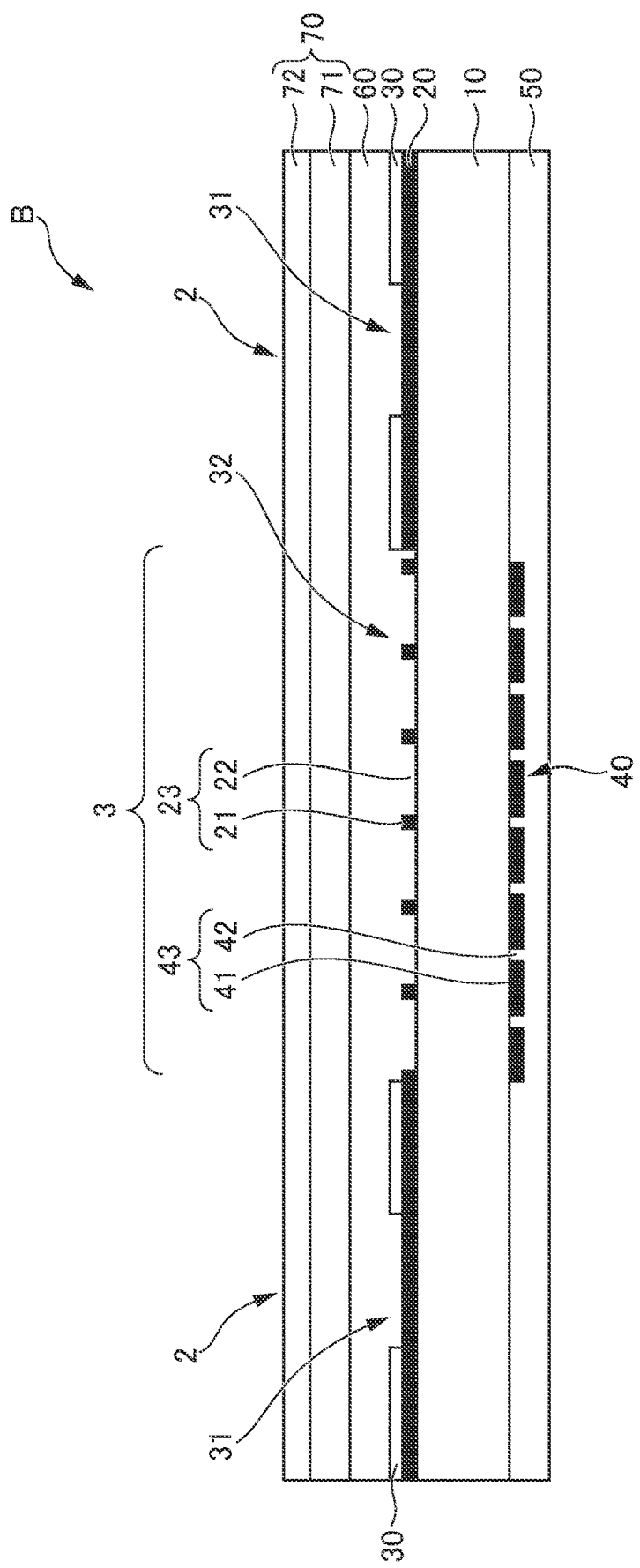
FIG. 18 is a cross-sectional view of the marker which is cut at the position of arrows A-A in FIG. 17.

FIG. 18 is a cross-sectional view of a marker which is cut at the position of arrows A-A in FIG. 17. The marker 1 includes a base material layer 10, a first layer 20, a second layer 30, a third layer 40, a reflective layer 50, an adhesive layer 60, and a protective layer 70, and is configured like a thin plate. The laminating order of these layers is an order of the reflective layer 50, the third layer 40, the base material layer 10, the first layer 20, the second layer 30, the adhesive layer 60, and the protective layer 70 from the back surface side.

The base material layer 10 includes a glass plate. By forming the base material layer 10 of a glass plate, it is possible to prevent the marker 1 from expanding and contracting due to temperature change and moisture absorption. The linear expansion coefficient of the glass plate is, for example, about $31.7 \times 10^{-7}/°$ C., and the dimensional change caused by the temperature change is very small. Further, the linear expansion coefficient of ceramics is, for example, about $28 \times 10^{-7}/°$ C., and the dimensional change caused by the temperature change is very small like glass. Therefore, ceramics may be used for the base material layer. In order to suppress the dimensional change caused by the temperature change, it is desirable that the base material layer 10 has a linear expansion coefficient of $35 \times 10^{-6}/°$ C. or less. It is desirable that the layer thickness of the base material layer 10 is set to 0.3 mm or more and 2.3 mm or less. This is because if the layer thickness of the base material layer 10 is less than 0.3 mm, additional machining cannot be performed because the base material layer 10 cracks during the cutting processing, and if the layer thickness is larger than 2.3 mm, the weight is too large, and cannot be transported. The layer thickness of the base material layer 10 of the present embodiment is set to 0.7 mm.

The first layer 20 is formed of a resist material colored black (first color). The resist material constituting the first layer 20 of the present embodiment is a resist material which has lost photosensitivity as a result of performing development processing on a resist material having photosensitivity used in a photolithography step. Examples of the resist material to be used for the first layer 20 (in the case of black color) include PMMA, ETA, HETA, HEMA, a mixture with epoxy, and the like. Examples of the material to be colored black include carbon, titanium blackened, nickel oxide, and the like. In the present embodiment, since the first layer 20 is formed of the resist material, the surface of the first layer 20 can be formed very smoothly, which makes the first layer 20 desirable as a base for forming the second layer 30 described later. Further, since the first layer 20 is formed of the resist material, a first pattern 23 described below can be manufactured accurately and easily. It is desirable that the layer thickness of the first layer 20 (in the case of black color) is 1 µm or more and 5 µm or less. This is because if the layer thickness of the first layer 20 is 1 µm or less, it cannot be uniformly formed, and if the layer thickness of the first layer 20 is greater than 5 µm, the curing reactivity of the resin by ultraviolet rays is insufficient.

The first layer 20 constitutes a portion of the mark 2 that appears black. Further, the first layer 20 constitutes a first pattern 23 for displaying a moire in the moire display region 3. The first pattern 23 is arranged in a region serving as the moire display region 3 on one surface (on the front surface) of the base material layer 10. In the first pattern 23, first display lines 21 are arranged at equal intervals in a constant arrangement direction in the longitudinal direction of the moire display region 3. A portion which is located between the adjacent first display lines 21 and in which no first display line 21 is provided is a first non-display region 22, and the first display lines 21 and the first non-display regions 22 are alternately arranged. The first pattern 23 is formed by photolithography processing.

The second layer 30 is formed of a resist material colored white (second color). The resist material constituting the second layer 30 of the present embodiment is a resist material which has lost photosensitivity as a result of performing developing processing on a resist material having photosensitivity to be used in a photolithography step. Examples of the resist material to be used for the second layer 30 (in the case of white color) include PMMA, ETA, HETA, HEMA, a mixture with epoxy, and the like. Examples of the material to be colored white include titanium oxide, zirconia, barium titanate, and the like. The second layer 30 has opening portions 31 formed at three locations at which the portions corresponding to the marks 2 are opened to visualize the first layer 20, and has opening portions 32 formed at two locations at which the portions corresponding to the moire display regions 3 and 4 are opened to visualize the first layer 20 and the third layer 40. These opening portions 31 and the opening portions 32 are formed by photolithography processing.

It is desirable that the layer thickness of the second layer 30 is set to 3 µm or more and 100 µm or less. This is because if the layer thickness of the second layer 30 is smaller than 3 µm, the first layer 20 of the base is observed to be seen through the second layer 30, the contrast is lowered, and the visibility of the mark 2 (easiness of detection by automatic recognition) deteriorates. Further, this is because if the layer thickness of the second layer 30 is larger than 100 µm, in the case of observing the mark 2 in a diagonal direction, a region where the first layer 20 is shaded by the second layer 30 and cannot be seen at the peripheral edge portion of the opening portion 31 increases, so that the distortion of the observed shape of the mark 2 increases.

The third layer 40 is formed of a resist material colored black (first color). The third layer 40 of the present embodiment includes the same material as the first layer 20, and a preferable film thickness is also the same as that of the first layer 20. Since the third layer 40 is formed of the resist material, a second pattern 43 described below can be accurately and easily manufactured.

The third layer 40 is provided with a second pattern 43 for displaying the moire in the moire display region 3. The second pattern 43 is arranged to face the first pattern 23 in a region serving as the moire display region 3 on the back surface of the base material layer 10. In the present embodiment, the first pattern 23 is provided on one surface of the base material layer 10, and the second pattern 43 is provided on the other surface. However, the first pattern 23 and the second pattern 43 may be configured so that they are provided on different base materials or the like, and then bonded to each other. In the second pattern 43, second display lines 41 are arranged at equal intervals in a constant arrangement direction in the longitudinal direction of the moire display region 3. A portion which is located between the adjacent second display lines 41 and in which no second display line 41 is provided is a second non-display region 42, and the second display lines 41 and the second non-display regions 42 are alternately arranged. The second pattern 43 is formed by photolithography processing.

The reflective layer 50 is a layer for reflecting light arriving from the front side (observation side) of the marker 1 through the opening portion 32 to the front side. It is desirable that the reflective layer 50 can be configured by using, for example, PMMA, ETA, HETA, HEMA, or a mixture with epoxy, and the like, and it is white in order to enhance the contrast to the first display lines 21 and the second display lines 41. Examples of the material to be colored white include titanium oxide, zirconia, barium titanate, and the like.

Here, the reflective layer 50 may be configured such that it is laminated in close contact with the marker 1 so as to be integrated with the marker 1 as in the present embodiment, and also may be configured such that a reflective member or the like as another member is arranged on the back surface side of the marker 1. However, from the viewpoint of enabling the moire M to be seen more easily, the configuration of the present embodiment in which the reflective layer 50 is laminated and arranged in close contact with the marker 1 so as to be integrated with the marker 1 is more desirable. The reason for this will be described below.

Figure 19:
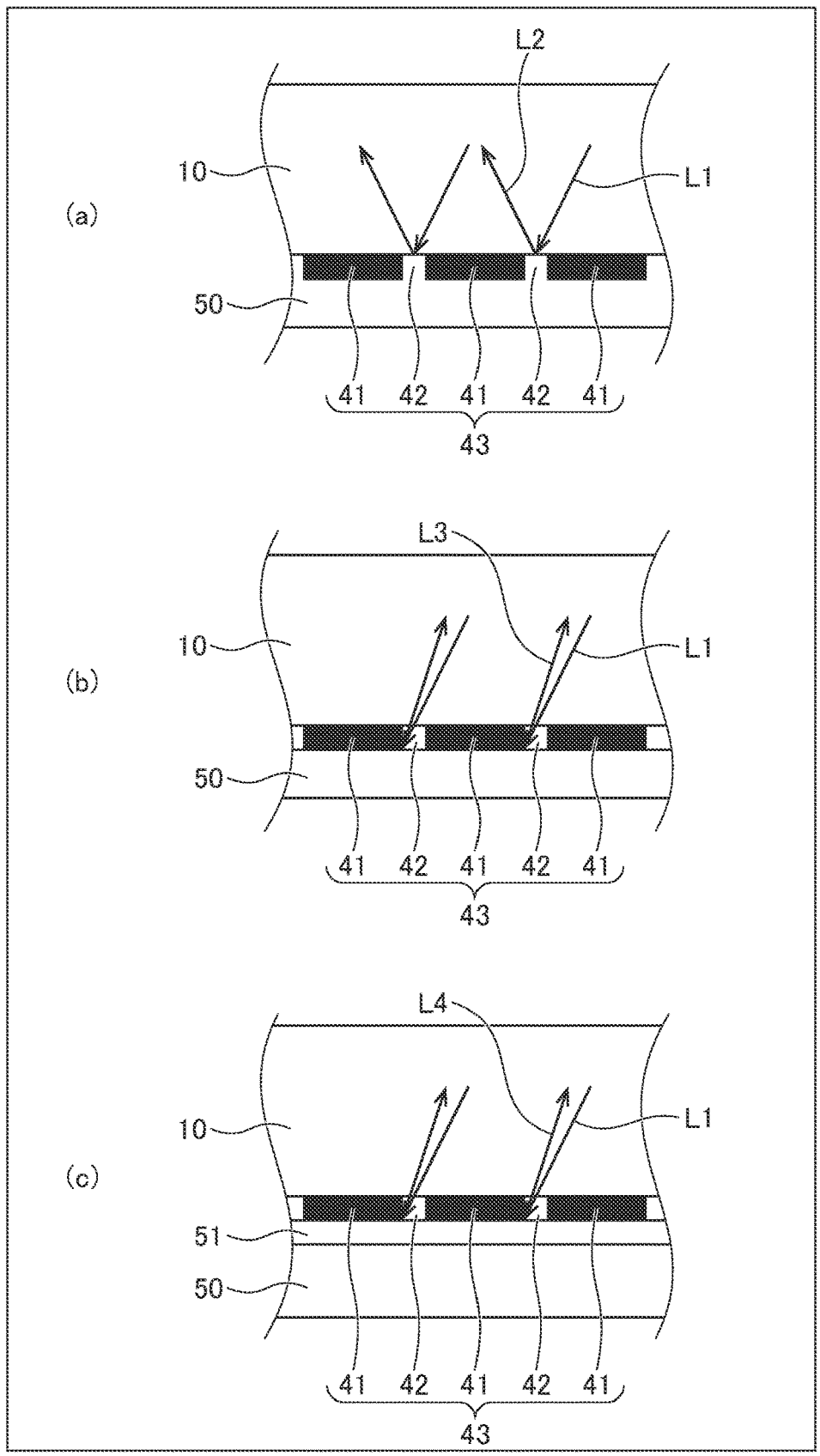
FIG. 19 is an enlarged view of the vicinity of a second pattern 43 in order to explain a cause of occurrence of unnecessary moire.

Moire M which is originally desired to be observed is moire to be observed due to interference between the first display lines 21 and the second display lines 41. However, unnecessary moire (extra noise image) occurs due to only the first display lines 21 and only the second display lines 41 under some conditions. FIG. 19 is an enlarged view of the vicinity of the second pattern 43 in order to explain a cause of the occurrence of unnecessary moire. In FIG. 19 (*a*) shows a configuration in which the reflective layer 50 is laminated to fill the second non-display regions 42. In FIG. 19 (*b*) shows a configuration in which the reflective layer 50 is laminated without filling the second non-display regions 42. In FIG. 19 (*c*) shows a configuration in which the reflective layer 50 is laminated and arranged via a bonding layer 51 such as an adhesive layer. When the second non-display regions 42 are not filled with the reflective layer 50 as in forms of FIG. 19 (*b*) and (*c*), light L1 incident from the observation side reflects from end portions of the second display lines 41, etc., and return to the observation side, which causes unnecessary light L3 and L4. It is considered that such unnecessary light L3 and L4 also occurs periodically, which causes unnecessary moire. On the other hand, in the configuration in which the reflective layer 50 is laminated to fill the second non-display regions 42 as shown in FIG. 19 (*a*), light cannot reach the end portions of the second display lines 41, etc., so that normal reflection light L2 returns to the observation side. Therefore, it is possible to suppress occurrence of unnecessary moire, and it is possible to observe clear moire. In this way, it is considered that when unnecessary moire of the second display lines 41 occurs due to light which scatters at side surface portions of the second display lines 41, that is, at the end surface portions of the second display lines 41 existing on the second non-display region 42 side and returns to an observer side, the unnecessary moire interferes with moire M that is originally desired to be seen, which disturbs observation of the moire M. Therefore, the reflective layer 50 is laminated so as to fill the second non-display regions 42, whereby the above phenomenon can be avoided and the moire M can be observed more clearly. For the above reason, the reflective layer 50 may be provided at least in the second non-display regions 42, but as shown in FIG. 18, it is desirable that the reflective layer 50 is provided so as to cover the back surface sides of the second display lines 41. The reason for this resides in that bounce of light from the edge portions on the back surface sides of the second display lines 41 is suppressed, and a main component of periodic bouncing light can be eliminated.

The adhesive layer 60 is a layer of an adhesive for sticking the protective layer 70 onto the second layer 30. The adhesive layer 60 includes a transparent adhesive so that the first layer 20 and the second layer 30 can be observed. The adhesive layer 60 can be formed by using, for example, PMMA, urethane, silicone, or the like. It is desirable that the layer thickness of the adhesive layer 60 is set to 0.5 µm or more and 50 µm or less. This is because if the layer thickness of the adhesive layer 60 is less than 0.5 µm, uniforming processing is difficult, and the asperities of the base cannot be absorbed. Further, this is because if the layer thickness of the adhesive layer 60 is larger than 50 µm, it takes much time and labor to remove the solvent during the thick coating processing, and the cost increases.

The protective layer 70 is a layer for protecting the first layer 20 and the second layer 30, and is stuck onto the second layer 30 via the adhesive layer 60. The protective layer 70 include a resin base material layer 71 and a surface layer 72.

The resin base material layer 71 has an adhesive layer 60 laminated on one surface thereof, and a surface layer 72 laminated on the other surface thereof. The resin base material layer 71 includes a transparent resin so that the first layer 20 and the second layer 30 can be observed. In the present embodiment, it is assumed that the marker 1 is used under visible light, and the adhesive layer 60 and the resin base material layer 71 are configured to be transparent to white light. Specifically, it is desirable that the adhesive layer 60 and the resin base material layer 71 each have a total light transmittance of 50% or more in a region where the wavelength of light is 400 nm to 700 nm. More desirably, the total light transmittance in the region where the wavelength of light is 400 nm to 700 nm is 50% or more in a state where the adhesive layer 60 and the resin base material layer 71 are measured together. It is desirable that the layer thickness of the resin base material layer 71 is set to 7 µm or more and 250 µm or less. This is because if the layer thickness of the resin base material layer 71 is less than 7 µm, lamination processing is difficult. Further, this is also because if the layer thickness of the resin base material layer 71 is larger than 250 µm, the bulk and weight thereof become too large, and the cost increases. Further, it is preferable that the refractive index of the resin base material layer 71 is 1.45 or more and 1.55 or less.

The surface layer 72 is a layer having both an antireflection function and a hard coat function. In order to prevent the visibility of the marks 2 and the moire display regions 3 and 4 from being deteriorated due to the reflection on the surface of the marker 1, it is desirable that the surface layer 72 has a reflectance of 1.5% or less for light having a wavelength of 535 nm. Further, as the hard coat function of the surface layer 72, it is desirable that the pencil hardness is equal to 1H or higher. The surface layer 72 can be configured by using, for example, sol-gel, siloxane, polysilazane, or the like. Examples of a specific method for the antireflection function include antireflection (AR) and antiglare method (AG), but the AR method is preferable for recognition of the mark 2 under a condition that strong light rays such as sunlight are not specularly reflected. Under a condition that strong light rays such as sunlight may be specularly reflected, the AG method is preferable for recognition of the mark 2. The AR method can be created by a known method such as multi-layer thin film interference or a moth-eye method, and the AG method may be created by a known method such as a method of kneading, into a film, light-diffusing particles for making the surface of the film to have asperities, or coating the particles onto the surface of the film.

Although the adhesive layer 60 is filled and exists in the first non-display regions 22 described above. However, the adhesive layer 60 and the protective layer 70 are transparent, and the base material layer 10 is made of glass and thus is transparent. Therefore, the second pattern 43 of the third layer 40 can be seen through the first non-display regions 22. Therefore, when the marker 1 is observed from the surface side thereof, the first pattern 23 and the second pattern 43 are seen while overlapping each other, and the moire M can be observed.

Further, as a characteristic of the combination of the adhesive layer 60 and the protective layer 70, it is desirable that the total light transmittance is 85% or more. This is because if the total light transmittance is less than 85%, a sufficient amount of light cannot be secured. Further, it is desirable as a characteristic of the combination of the adhesive layer 60 and the light diffusion layer 70 that the haze value is 30% or more, more preferably 40% or more, and further more preferably 70% or more. This is because if the haze value is lower than 70%, the effect of the present invention begins to deteriorate, if the haze value is equal to or less than 40%, the effect further deteriorates, and if the haze value is equal to or less than 30%, the effect significantly decreases. On the other hand, it is desirable that the haze value is equal to or less than 95%. This is because if the haze value is higher than 95%, the image of the observed mark is blurred.

Conventionally, as described in Patent Document 1 (U.S. Pat. No. 8,625,107), when a plurality of patterns are displayed overlapped with each other to generate moire, light is blocked by a pattern arranged on the observation side, so that the whole is observed darkly. Even when moire occurs under a dark environment, the moire is unclear, and it may be difficult to identify the position of the moire by photographing the moire with a camera. Therefore, in the present embodiment, the moire can be observed more clearly by improving the first pattern 23 and the second pattern 43.

Figure 20:
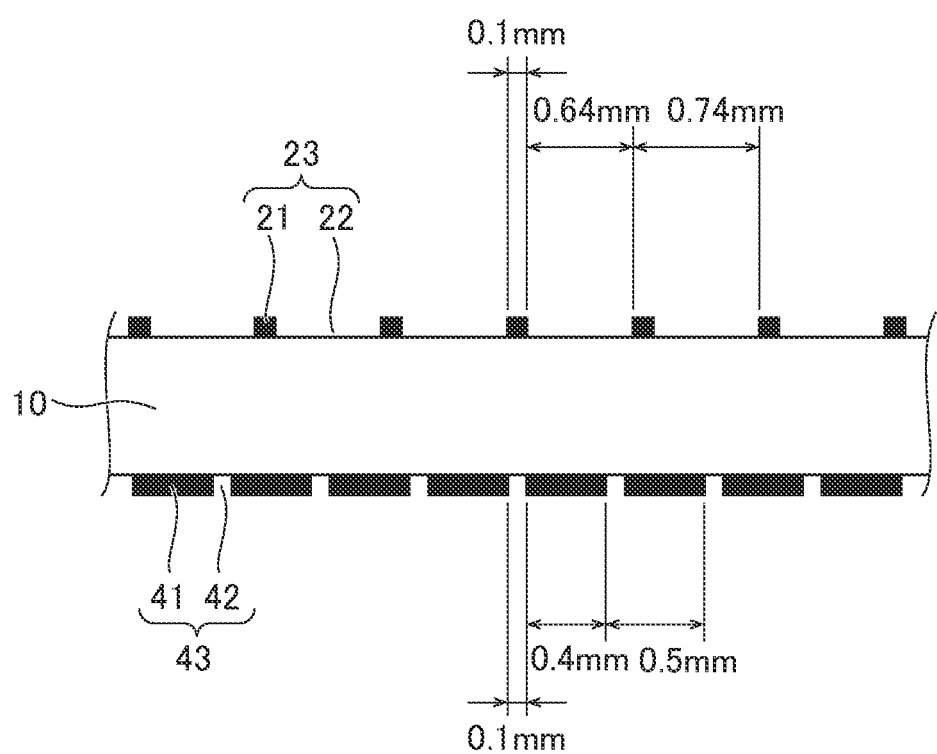
FIG. 20 is a diagram illustrating details of a first pattern 23 and the second pattern 43.

FIG. 20 is a diagram showing the details of the first pattern 23 and the second pattern 43. FIG. 20 shows a cross section similar to that of FIG. 18, but only three layers of the base material layer 10, the first layer 20, and the third layer 40 are shown. In the present embodiment, the width of the first non-display region 22 and the width of the second non-display region 42 are different from each other. Specifically, in the present embodiment, the width of the first non-display region 22 is set to 0.64 mm, and the width of the second non-display region 42 is set to 0.1 mm. Since the first non-display regions 22 are arranged on the observation side (front surface side), and the width of the first non-display regions 22 is larger than the width of the second non-display regions 42, so that a large amount of light passes through the first pattern 23 and reaches the second pattern 43, and most of light reflected from the second pattern 43 and returned to the observation side can pass through the first pattern 23 and reach the observation position. Therefore, the moire M can be observed more brightly.

Further, the width of the first display lines 21 and the width of the second display lines 41 are different from each other. This makes it possible to observe the moire M more clearly as compared with a case where both the widths are equal to each other. Specifically, the width of the first display lines 21 is set to 0.1 mm, and the width of the second display line is set to 0.4 mm. The width of the first display lines 21 is made narrower than the width of the second display lines as described above, so that a larger amount of light passes through the first pattern 23, and the moire M can be observed more brightly.

A first pitch which is the arrangement pitch of the first display lines 21 is set to 0.74 mm, and a second pitch which is the arrangement pitch of the second display lines 41 is set to 0.5 mm, thereby making both the pitches different from each other. As a result, the moire M can be observed more clearly. Since the first pitch is set to be larger than the second pitch, as a result, the width of the first non-display regions 22 is larger than the width of the second non-display regions 42, so that the moire M can be observed more brightly.

Figure 21:
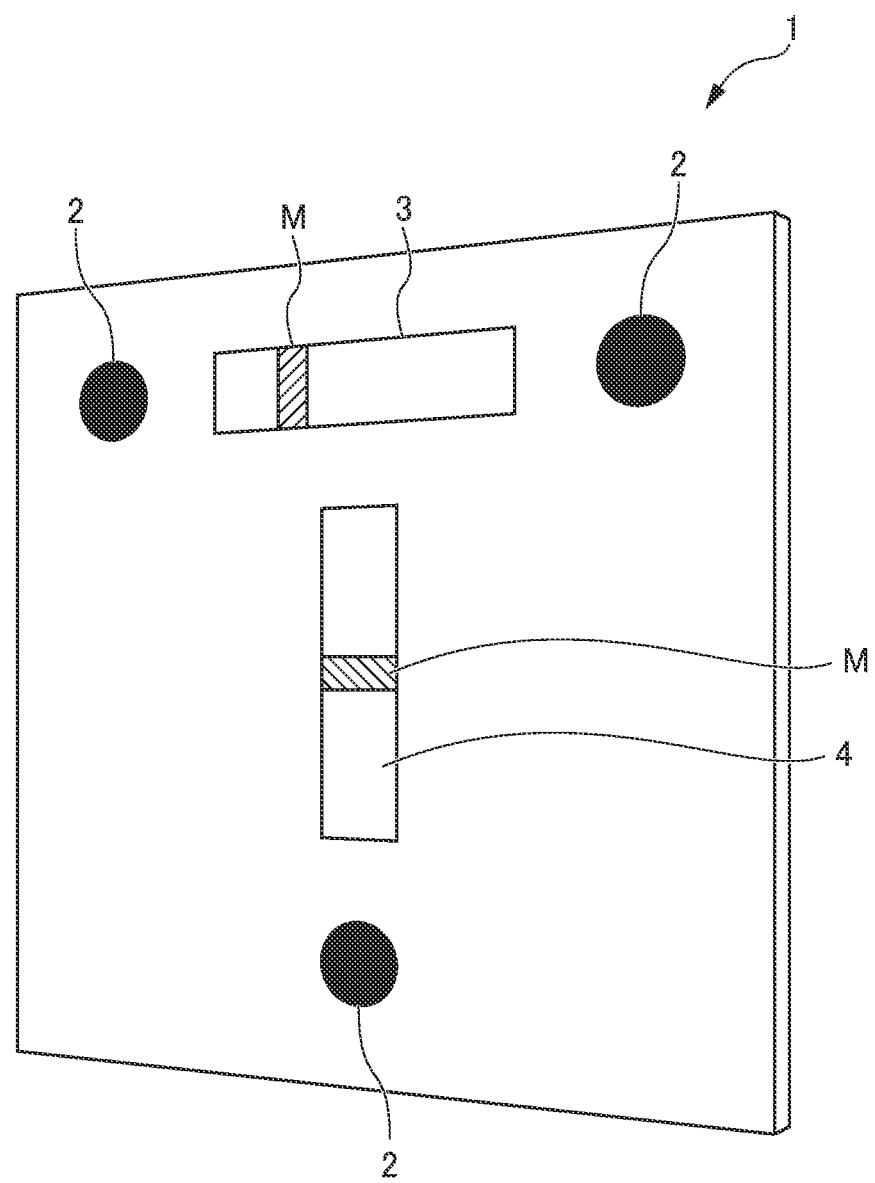
FIG. 21 is a diagram showing a state of the marker 1 when the marker 1 is viewed in a diagonal direction.

Next, an example of a way of using the marker 1 of the present embodiment will be described. FIG. 21 is a diagram showing a state of the marker 1 when the marker 1 is viewed in a diagonal direction. FIG. 21 shows a state in which the marker 1 is observed in a diagonal direction indicated by an arrow B in FIG. 18, but is observed without being tilted with respect to an up-and-down direction in FIG. 17. When the marker 1 is observed in a diagonal direction which is inclined from the normal direction thereof, for example, as shown in FIG. 21, the moire M in the moire display region 3 is observed as having shifted in the longitudinal direction of the moire display region 3. When the marker 1 is observed in the up-and-down diagonal direction which is inclined in the longitudinal direction of the moire display region 4 from the normal direction thereof, the moire M of the moire display region 4 is observed as having shifted in the longitudinal direction of the moire display region 4. Therefore, by observing both the moire M in the moire display region 3 and the moire M in the moire display region 4, the relative position (inclination angle) between the marker 1 and the observation position can be accurately detected. In other words, the marker 1 can configure a part of an angle sensor by using the marker 1 in combination with an imaging unit and a calculation unit.

Here, when the moire M shifts to a position where the observation position greatly deviates from the normal direction of the marker 1, another moire is started to be observed, and moire is observed one after another. Therefore, when the observation position is located at a position which deviates greatly from the normal direction of the marker 1, it is impossible to perform correct position detection in some cases. However, the marker 1 of the present embodiment includes the marks 2. In the position detection using the marks 2, the position detection can be performed even when the observation position greatly deviates from the normal direction of the marker 1. Further, in the position detection using the moire display regions 3 and 4, the position detection can be performed with higher accuracy than the position detection using the marks 2. Therefore, the position detection using the marks 2 and the position detection using the moire display regions 3 and 4 are used together with each other, whereby an applicable range can be expanded as compared with the case where only the moire display regions 3 and 4 are used. In other words, even when the observation position is located at a position which deviates greatly from the normal direction of the marker 1, it is possible to perform the position detection using marks 2, automatically shift the observation position according to a detection result, and perform the position detection using the moire display regions 3 and 4 at a stage where final highly-accurate position control is required.

As described above, according to the marker 1 of the present embodiment, since the width of the first non-display regions 22 is larger than the width of the second non-display regions 42, a larger amount of light can be taken into the moire display regions 3 and 4, and a larger amount of light can be returned to the observation side, so that the moire M can be displayed more brightly. Therefore, even when the moire M displayed in the moire display regions 3 and 4 is photographed by a camera or the like, the position thereof can be acquired more accurately, and highly accurate position detection can be implemented.

Fifth Embodiment

Figure 22:
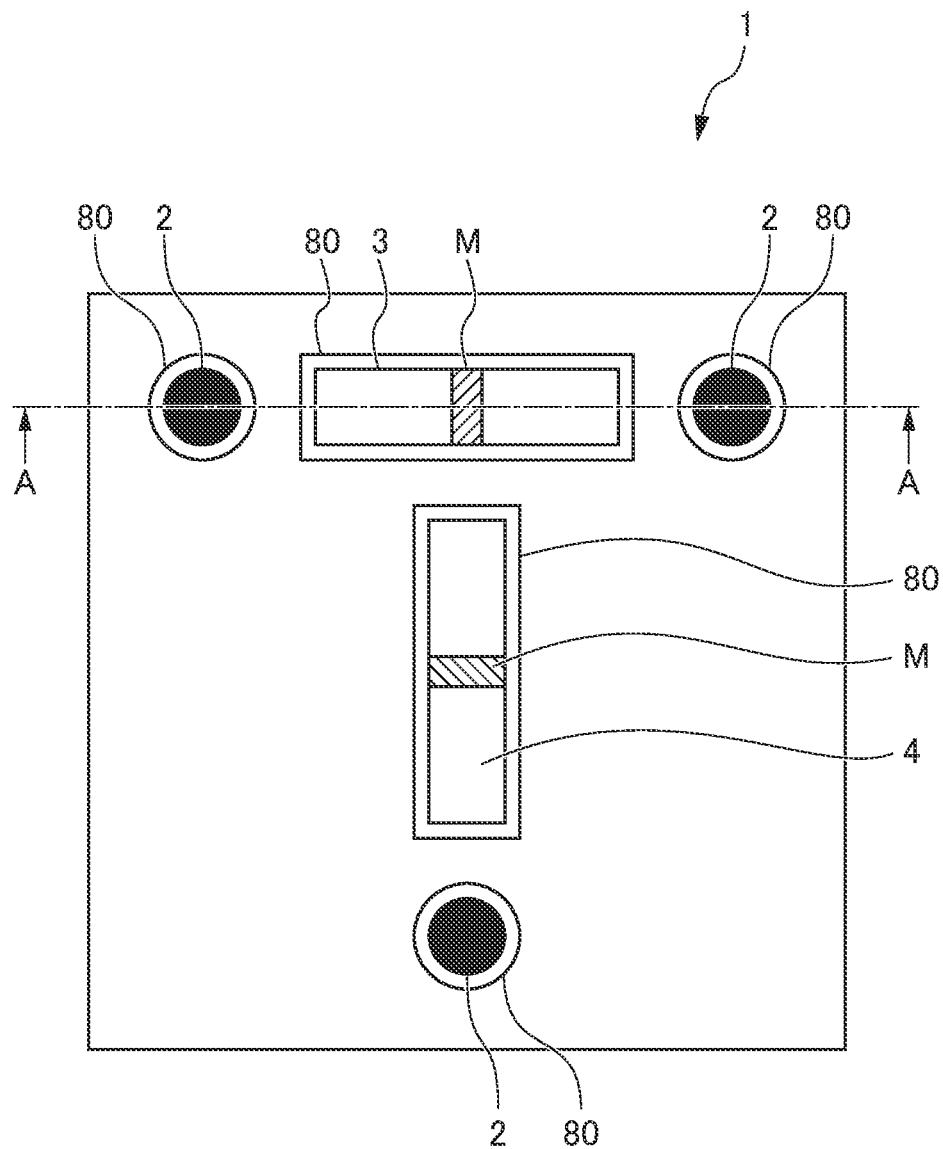
FIG. 22 is a diagram showing a fifth embodiment of the marker according to the present invention.

FIG. 22 is a diagram showing a fifth embodiment of the marker according to the present invention. The following figures including FIG. 22 are schematic diagrams, and the sizes and shapes of respective parts are presented by being exaggerated or omitted as appropriate to facilitate understanding thereof. Further, the following description will be made while presenting specific numerical values, shapes, materials, and the like, but these can be changed as appropriate. In the present specification, terms such as plate, sheet, and film are used. The terms of plate, sheet, and film are generally used in the decreasing order of thickness, and these terms are also used in the same way in the present specification. However, such a manner of use has no technical meaning, and thus these terms may be replaced as appropriate. Further, in the present invention, a "transparent" substance means a substance which transmits therethrough light having at least a wavelength to be used. For example, if a substance transmits infrared rays although it does not transmit visible light, the substance shall be treated as a transparent substance when used for applications using infrared rays. It should be noted that specific numerical values specified in the present specification and the claims should be treated as including a general error range. In other words, a difference of about ±10% is substantially the same, and a value set in a range slightly beyond the numerical range of the present invention should be interpreted as being substantially within the numerical range of the present invention.

Figure 23:
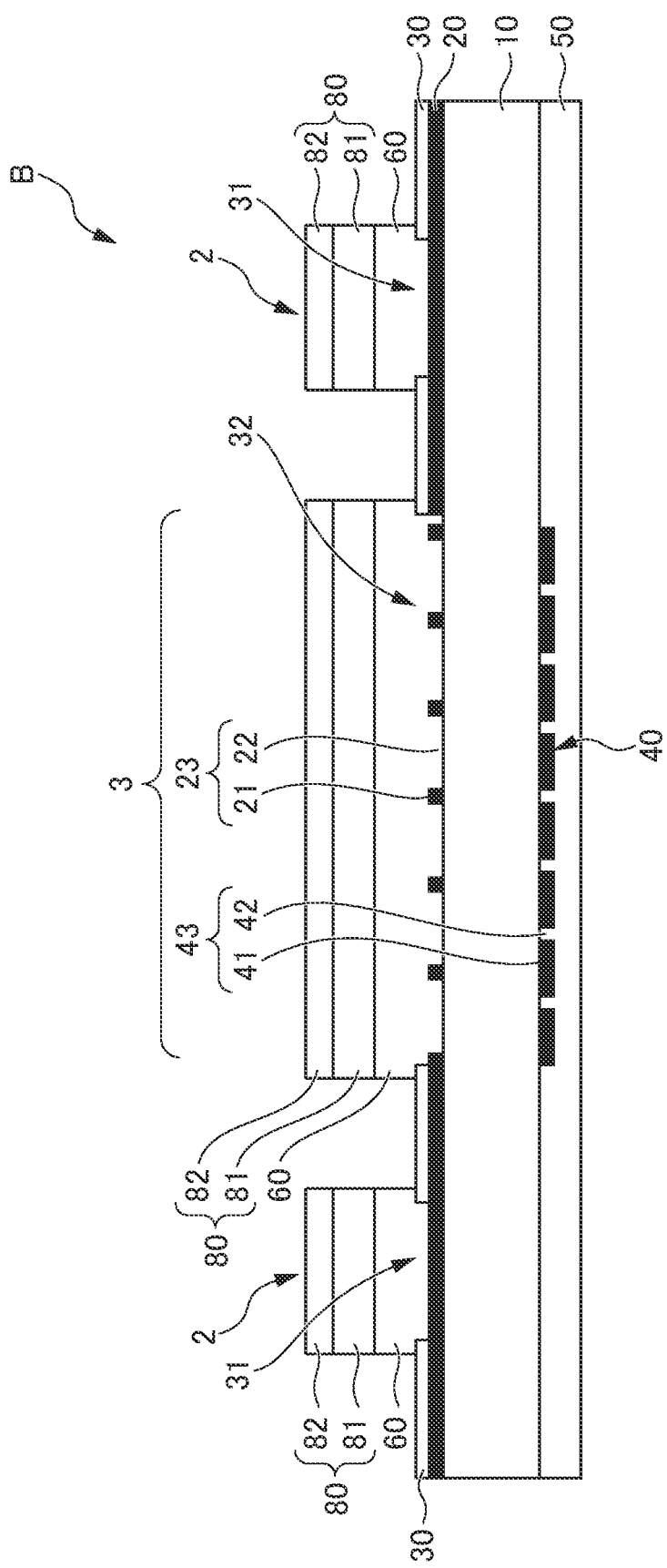
FIG. 23 is a cross-sectional view of the marker which is cut at the position of arrows A-A in FIG. 22.

As shown in FIG. 22, the marker 1 is configured like a plate having a substantially square shape when viewed from the normal direction of the surface on which a light diffusion layer 80 described later is provided, and includes marks 2, and moire display regions 3 and 4. In the present embodiment, the marker 1 is formed so that the shape thereof as seen from the surface side is a square shape of 60 mm×60 mm. The marker 1 detects the relative positional relationship between the photographing position and the marker 1 according to how the marks 2 are observed (hereinafter, also simply referred to as position detection), and further, the position detection can be performed with higher accuracy according to how moire displayed in the moire display regions 3 and 4 is observed. In the marker 1, a surface shown in FIG. 22 is a front side (front surface) to be observed, an opposite side thereto is a back side (back surface). In FIG. 23 described later, a side on which the light diffusion layer 80 is provided is a front side (front surface) to be observed.

The marks 2 are arranged at two places near two upper corners in FIG. 22 and one place near the lower right-and-left center, totally three marks are arranged to be spaced from one another. The mark 2 is configured to be observable as a mark having an independent shape. Note that a mark having an independent shape means that a plurality of marks are not connected and each of the marks has an individually recognizable form. It is desirable that at least three marks 2 are arranged. This is because, for example, if the positions of the centers of gravity of the marks 2 are calculated at three points from an observation result of the marks 2, the relative position and inclination between the observation position (camera or the like) and the marker 1 can be accurately detected. Further, if the number of marks 2 is larger than 3, for example, when some marks 2 are unclearly observed due to some kind of obstacle, the position detection can be performed from an observation result of the remaining marks 2. By using a plurality of marks 2, the accuracy of position detection can be improved. In the present embodiment, the mark 2 is configured in a circular shape. However, the mark 2 is not limited to the circular shape, and it may be formed to in a polygonal shape such as a triangle or a quadrangle, or another shape.

The moire display regions 3 and 4 display the moire M. FIG. 22 shows a state in which the moires M are displayed in the centers of the moire display regions 3 and 4 in both the moire display regions 3 and 4. The position where the moire M is displayed shifts when the relative position (angle) between the marker 1 and the observation position changes. In the present embodiment, each of the moire display regions 3 and 4 has a length of 30 mm in the longitudinal direction, and the display position of the moire M shifts along the longitudinal direction. The moire display region 3 and the moire display region 4 are arranged so that their longitudinal directions are orthogonal to each other. Since the moire display regions 3 and 4 have the same configuration except that the arrangement directions thereof are different from each other, the moire display region 3 will be described below.

FIG. 23 is a cross-sectional view of a marker which is cut at the position of arrows A-A in FIG. 22. The marker 1 includes a base material layer 10, a first layer 20, a second layer 30, a third layer 40, a reflective layer 50, an adhesive layer 60, and a light diffusion layer 80, and is configured like a thin plate. The laminating order of these layers is an order of the reflective layer 50, the third layer 40, the base material layer 10, the first layer 20, the second layer 30, the adhesive layer 60, and the light diffusion layer 80 from the back surface side.

The base material layer 10 includes a glass plate. By forming the base material layer 10 of a glass plate, it is possible to prevent the marker 1 from expanding and contracting due to temperature change and moisture absorption. The linear expansion coefficient of the glass plate is, for example, about $31.7 \times 10^{-7}/°$ C., and the dimensional change caused by the temperature change is very small. Further, the linear expansion coefficient of ceramics is, for example, about $28 \times 10^{-7}/°$ C., and the dimensional change caused by the temperature change is very small like glass. Therefore, ceramics may be used for the base material layer. In order to suppress the dimensional change caused by the temperature change, it is desirable that the base material layer 10 has a linear expansion coefficient of $35 \times 10^{-6}/°$ C. or less. It is desirable that the layer thickness of the base material layer 10 is set to 0.3 mm or more and 2.3 mm or less. This is because if the layer thickness of the base material layer 10 is less than 0.3 mm, additional machining cannot be performed because the base material layer 10 cracks during the cutting processing, and if the layer thickness is larger than 2.3 mm, the weight is too large, and cannot be transported. The layer thickness of the base material layer 10 of the present embodiment is set to 0.7 mm.

The first layer 20 is formed of a resist material colored black (first color). The resist material constituting the first layer 20 of the present embodiment is a resist material which has lost photosensitivity as a result of performing development processing on a resist material having photosensitivity used in a photolithography step. Examples of the resist material to be used for the first layer 20 (in the case of black color) include PMMA, ETA, HETA, HEMA, a mixture with epoxy, and the like. Examples of the material to be colored black include carbon, titanium blackened, nickel oxide, and the like. In the present embodiment, since the first layer 20 is formed of the resist material, the surface of the first layer 20 can be formed very smoothly, which makes the first layer 20 desirable as a base for forming the second layer 30 described later. Further, since the first layer 20 is formed of the resist material, a first pattern 23 described below can be manufactured accurately and easily. It is desirable that the layer thickness of the first layer 20 (in the case of black color) is 1 μm or more and 5 μm or less. This is because if the layer thickness of the first layer 20 is 1 μm or less, it cannot be uniformly formed, and if the layer thickness of the first layer 20 is greater than 5 μm, the curing reactivity of the resin by ultraviolet rays is insufficient.

The first layer 20 constitutes a portion of the mark 2 that appears black. Further, the first layer 20 constitutes a first pattern 23 for displaying a moire in the moire display region 3. The first pattern 23 is arranged in a region serving as the moire display region 3 on one surface (on the front surface) of the base material layer 10. In the first pattern 23, first display lines 21 are arranged at equal intervals in a constant arrangement direction in the longitudinal direction of the moire display region 3. A portion which is located between the adjacent first display lines 21 and in which no first display line 21 is provided is a first non-display region 22, and the first display lines 21 and the first non-display regions 22 are alternately arranged. The first pattern 23 is formed by photolithography processing.

The second layer 30 is formed of a resist material colored white (second color). The resist material constituting the second layer 30 of the present embodiment is a resist material which has lost photosensitivity as a result of performing developing processing on a resist material having photosensitivity to be used in a photolithography step. Examples of the resist material to be used for the second layer 30 (in the case of white color) include PMMA, ETA, HETA, HEMA, a mixture with epoxy, and the like. Examples of the material to be colored white include titanium oxide, zirconia, barium titanate, and the like. The second layer 30 has opening portions 31 formed at three locations at which the portions corresponding to the marks 2 are opened to visualize the first layer 20, and has opening portions 32 formed at two locations at which the portions corresponding to the moire display regions 3 and 4 are opened to visualize the first layer 20 and the third layer 40. These opening portions 31 and the opening portions 32 are formed by photolithography processing.

It is desirable that the layer thickness of the second layer 30 is set to 3 µm or more and 100 µm or less. This is because if the layer thickness of the second layer 30 is smaller than 3 µm, the first layer 20 of the base is observed to be seen through the second layer 30, the contrast is lowered, and the visibility of the mark 2 (easiness of detection by automatic recognition) deteriorates. Further, this is because if the layer thickness of the second layer 30 is larger than 100 µm, in the case of observing the mark 2 in a diagonal direction, a region where the first layer 20 is shaded by the second layer 30 and cannot be seen at the peripheral edge portion of the opening portion 31 increases, so that the distortion of the observed shape of the mark 2 increases.

The third layer 40 is formed of a resist material colored black (first color). The third layer 40 of the present embodiment includes the same material as the first layer 20, and a preferable film thickness is also the same as that of the first layer 20. Since the third layer 40 is formed of the resist material, a second pattern 43 described below can be accurately and easily manufactured.

The third layer 40 is provided with a second pattern 43 for displaying the moire in the moire display region 3. The second pattern 43 is arranged to face the first pattern 23 in a region serving as the moire display region 3 on the back surface of the base material layer 10. In the present embodiment, the first pattern 23 is provided on one surface of the base material layer 10, and the second pattern 43 is provided on the other surface. However, the first pattern 23 and the second pattern 43 may be configured so that they are provided on different base materials or the like, and then bonded to each other. In the second pattern 43, second display lines 41 are arranged at equal intervals in a constant arrangement direction in the longitudinal direction of the moire display region 3. A portion which is located between the adjacent second display lines 41 and in which no second display line 41 is provided is a second non-display region 42, and the second display lines 41 and the second non-display regions 42 are alternately arranged. The second pattern 43 is formed by photolithography processing.

The reflective layer 50 is a layer for reflecting light arriving from the front side (observation side) of the marker 1 through the opening portion 32 to the front side. It is desirable that the reflective layer 50 can be configured by using, for example, PMMA, ETA, HETA, HEMA, or a mixture with epoxy, and the like, and it is white in order to enhance the contrast to the first display lines 21 and the second display lines 41. Examples of the material to be colored white include titanium oxide, zirconia, barium titanate, and the like.

Here, the reflective layer 50 may be configured such that it is laminated in close contact with the marker 1 so as to be integrated with the marker 1 as in the present embodiment, and also may be configured such that a reflective member or the like as another member is arranged on the back surface side of the marker 1. However, from the viewpoint of enabling the moire M to be seen more easily, the configuration of the present embodiment in which the reflective layer 50 is laminated and arranged in close contact with the marker 1 so as to be integrated with the marker 1 is more desirable. The reason for this will be described below.

Moire M which is originally desired to be observed is moire to be observed due to interference between the first display lines 21 and the second display lines 41. However, unnecessary moire (extra noise image) occurs due to only the first display lines 21 and only the second display lines 41 under some conditions. It is considered that when unnecessary moire of the second display lines 41 occurred by light which scatters at end surface portions of the second display lines 41, that is, at end surface portions of the second display lines 41 existing on the second non-display region 42 side and returns to the observer side, the unnecessary moire interferes with moire M which is originally desired to be seen to disturb the observation of the moire M. Therefore, the reflective layer 50 is provided so as to fill the second non-display regions 42, whereby the above phenomenon can be avoided and the moire M can be observed more clearly. For the above reason, the reflective layer 50 may be provided at least in the second non-display regions 42, but as shown in FIG. 23, it is desirable that the reflective layer 50 is provided so as to cover the back surface sides of the second display lines 41. The reason for this resides in that the bounce of light from the edge portions on the back surface sides of the second display lines 41 is suppressed, and the main component of periodic bounce light can be eliminated.

The adhesive layer 60 is a layer of an adhesive for sticking the light diffusion layer 80 onto the second layer 30. The adhesive layer 60 can be formed by using, for example, PMMA, urethane, silicone, or the like. It is desirable that the layer thickness of the adhesive layer 60 is set to 0.5 µm or more and 50 µm or less. This is because if the layer thickness of the adhesive layer 60 is less than 0.5 µm, uniforming processing is difficult, and the asperities of the base cannot be absorbed. Further, this is because if the layer thickness of the adhesive layer 60 is larger than 50 µm, it takes much time and labor to remove the solvent during the thick coating processing, and the cost increases. Further, the adhesive layer 60 is provided only in the same range as the range in which the light diffusion layer 80 is provided.

The light diffusion layer 80 is provided in an island-like shape on the marks 2 and the moire display regions 3 and 4 via the adhesive layer 60 so as to cover the marks 2 and the moire display regions 3 and 4 slightly over the regions of them. Specifically, the light diffusion layer 80 is provided in an island-like shape in a range which is larger than the mark 2 by 2 to 3 mm on one side (in radius). Similarly, the light diffusion layer 80 is provided in an island-like shape in a range which is larger than each of the moire display regions 3 and 4 by 2 to 3 mm on one side (in extended width on one side). The light diffusion layer 80 is provided in an island-like shape, and it is not provided in other portions, which makes it possible to easily provide the light diffusion layer later if necessary. Further, it can be prevented in advance that when strong light such as sunlight is incident to only one island-shaped light diffusion layer 80, if the light diffusion layer 80 (including a resin base material layer 81) is connected, the light propagates to another island-shaped light diffusion layer 80 with the resin base material layer 81 serving as a light guide, thereby affecting the other island. The light diffusion layer 80 has a resin base material layer 81 and a surface layer 82.

The resin base material layer 81 has an adhesive layer 60 laminated on one surface thereof, and a surface layer 82 laminated on the other surface thereof. The resin base material layer 81 includes a transparent resin so that the first layer 20 and the second layer 30 can be observed. In the present embodiment, it is assumed that the marker 1 is used under visible light, and the adhesive layer 60 and the resin base material layer 81 are configured to be transparent to white light. Specifically, it is desirable that the adhesive layer 60 and the resin base material layer 81 each have a total light transmittance of 50% or more in a region where the wavelength of light is 400 nm to 700 nm. More desirably, the total light transmittance in the region where the wavelength of light is 400 nm to 700 nm is 50% or more in the state where the adhesive layer 60 and the resin base material layer 81 are measured together. It is desirable that the layer thickness of the resin base material layer 81 is set to 7 μm or more and 250 μm or less. This is because if the layer thickness of the resin base material layer 81 is less than 7 μm, lamination processing is difficult. Further, this is also because if the layer thickness of the resin base material layer 81 is larger than 250 μm, the bulk and weight thereof become too large, and the cost increases. Further, it is preferable that the refractive index of the resin base material layer 81 is 1.45 or more and 1.55 or less.

The surface layer 82 is a layer that exerts a light diffusing action. The surface layer 82 of the present embodiment has micro asperities on the surface thereof, and constitutes a so-called matte surface (rough surface). The surface layer 82 diffuses surface reflected light by means of the micro asperities. Here, various antireflection layers to be applied to antiglare films can be applied to the surface layer 82 having such micro asperities. For example, the surface layer 82 may be prepared by embossing, may be prepared with the surface thereof being made as a rough surface by mixing translucent fine particles, may be prepared with the surface thereof being made as a rough surface (so-called chemical matte surface) by solving the surface with a chemical agent, or may be prepared by shaping processing using a shaping resin layer.

Further, the surface layer 82 has a hard coat function. Further, as a hard coat function of the surface layer 82, it is desirable that the pencil hardness is equal to 1H or higher. By providing the surface layer 82 with a hard coat function, the light diffusion layer 80 can also have a function as a protective layer. Further, it is desirable that the surface layer 82 has a regular reflectance of 1.5% or less for light having a wavelength of 535 nm in order to prevent deterioration in visibility of the mark 2 and the moire display regions 3 and 4 due to the reflection at the surface of the marker 1.

Further, it is desirable as a characteristic of the composition of the adhesive layer 60 and the light diffusion layer 80 that the total light transmittance is 85% or more. This is because if the total light transmittance is less than 85%, a sufficient amount of light cannot be secured. Further, it is desirable as a characteristic of the combination of the adhesive layer 60 and the light diffusion layer 80 that the haze value is 30% or more, more preferably 40% or more, and further preferably 70% or more. This is because if the haze value is lower than 70%, the effect of the present invention begins to deteriorate, if the haze value is equal to or less than 40%, the effect further deteriorates, and if the haze value is equal to or less than 30%, the effect significantly deteriorates. On the other hand, it is desirable that the haze value is equal to or less than 95%. This is because if the haze value is higher than 95%, the image of the observed mark is blurred.

Figure 24:
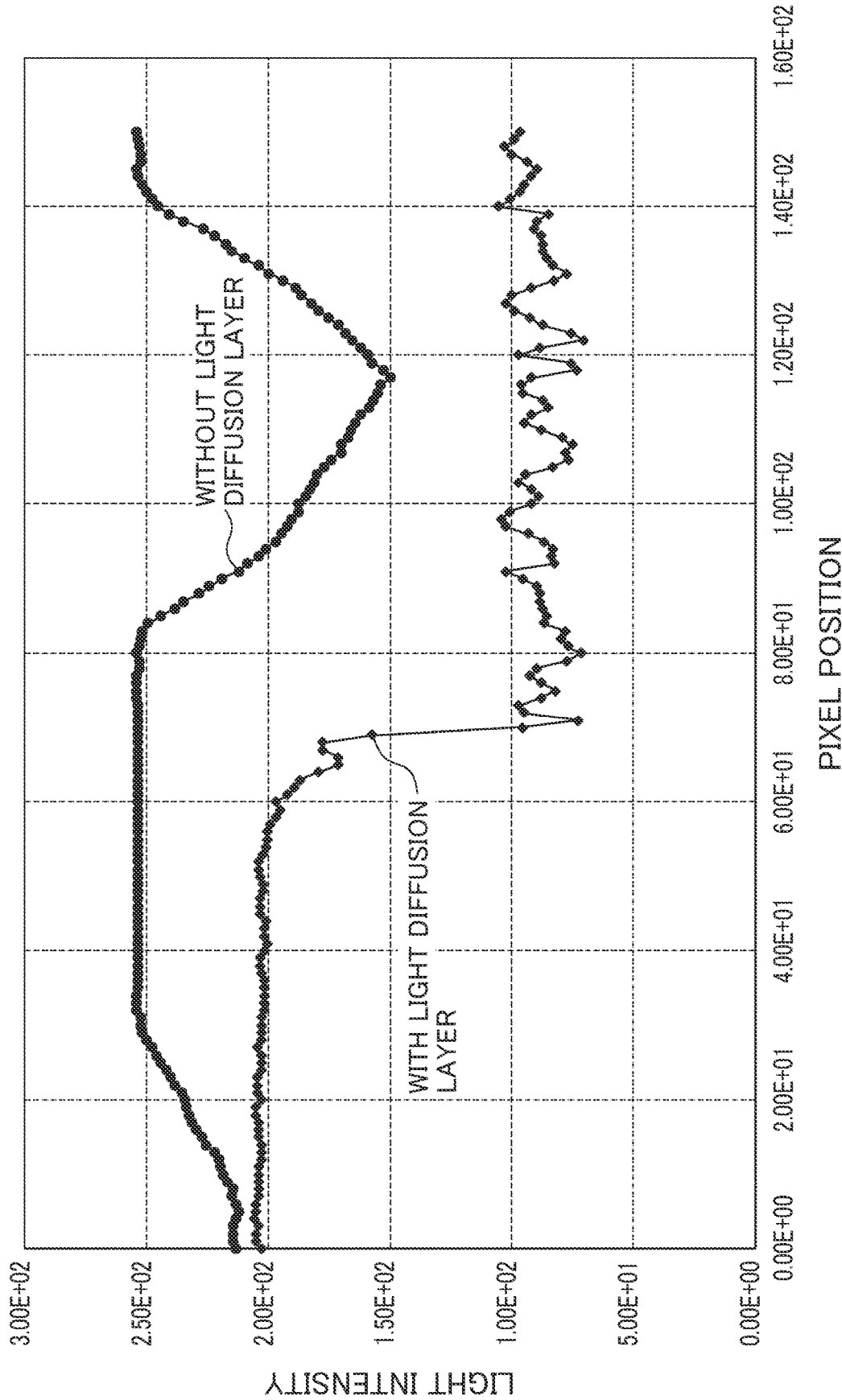
FIG. 24 is a graph showing an effect of a light diffusion layer 80.

FIG. 24 is a graph showing the effect of the light diffusion layer 80. In order to confirm the effect obtained by providing the light diffusion layer 80, two types of markers were actually created with and without the light diffusion layer 80. The two types of markers are illuminated so that reflected light is strongly returned to the camera with respect to the positions of the marks 2 of the two types of the markers to photograph these two types of markers, and the change in light intensity in the neighborhood of a white-and-black reversed site of the mark 2 depending on the position of the mark is quantified, and shown in FIG. 24. As shown in FIG. 24, when the light diffusion layer 80 is not provided, the reflection of the illumination light appeared as a waveform as it was, and the waveform corresponding to the shape of the mark 2 was not seen. The light intensity in the case of provision of no light diffusion layer 80 is too strong, and exceeds a measurement limit (2.50E+02). On the other hand, when the light diffusion layer 80 was provided, recognizable data was obtained by appropriately separating the light intensity of a white portion and the light intensity of a black portion from each other according to the position of the mark 2. When the light diffusion layer 80 was measured with a haze meter "HM-150" manufactured by Murakami Color Research Institute based on JIS K7136, the total light transmittance was equal to 90.3%, and the haze value was equal to 75.1%. As can be seen from FIG. 24, when the light diffusion layer is arranged so as to straddle across the mark and its peripheral portion, the shape (outline) of the mark can be clearly captured by the camera. When the light diffusion layer is placed only on the mark with the same shape and size as the mark, the resin base material layer portion of the light diffusion layer acts as a light guide plate, so that light is emitted from the end portion of the resin base material layer, which causes a problem that the shape (outline) of the mark is unclear.

Figure 25:
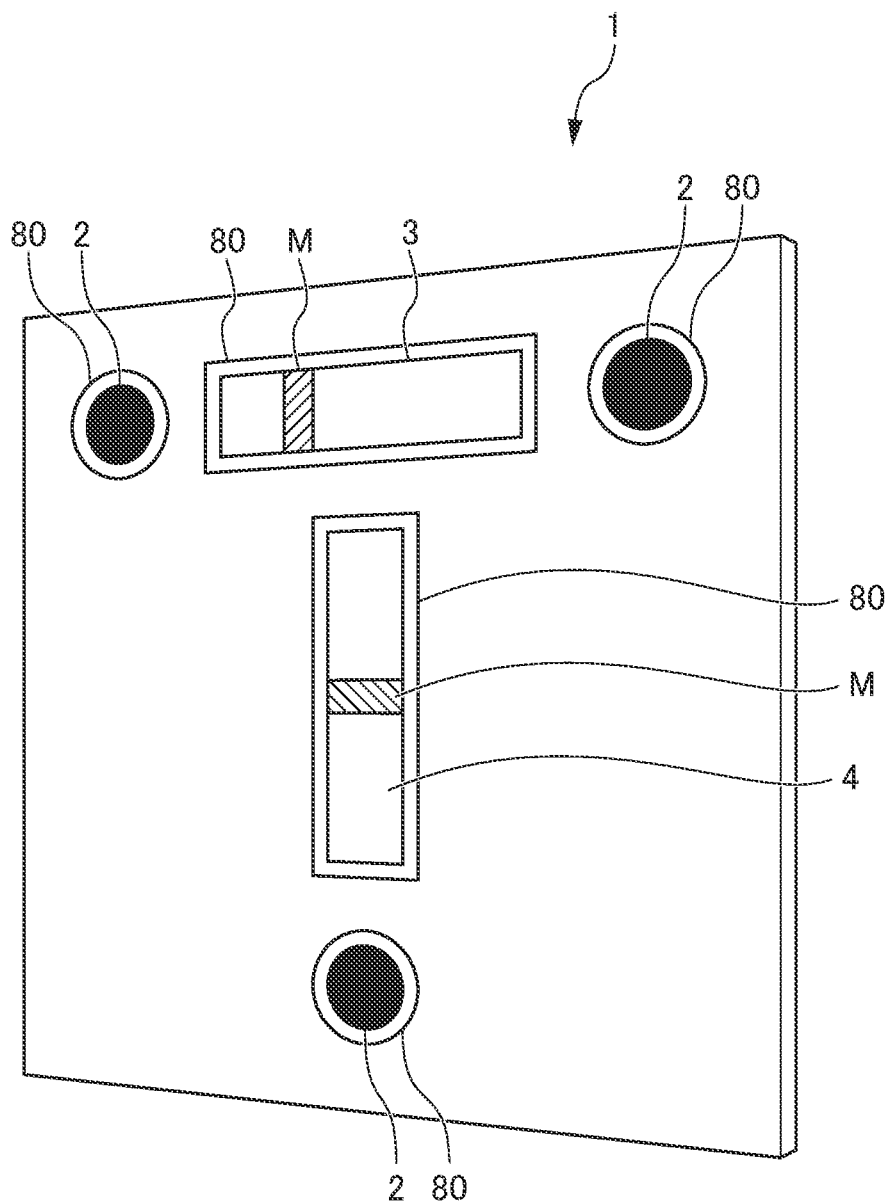
FIG. 25 is a diagram showing a state of the marker 1 when the marker 1 is viewed in a diagonal direction.

Next, an example of a way of using the marker 1 of the present embodiment will be described. FIG. 25 is a diagram showing a state of the marker 1 when the marker 1 is viewed in a diagonal direction. FIG. 25 shows a state in which the marker 1 is observed in the diagonal direction indicated by the arrow B in FIG. 23, but it is observed without being tilted in the up-and-down direction in FIG. 22. When the marker 1 is observed in a diagonal direction which is inclined from the normal direction thereof, for example, as shown in FIG. 25, the moire M of the moire display region 3 is observed by being shifted in the longitudinal direction of the moire display region 3. When the marker 1 is observed in a vertically diagonal direction which is inclined from the normal direction thereof in the longitudinal direction of the moire display region 4, the moire M of the moire display region 4 is observed by being shifted in the longitudinal direction of the moire display region 4. Therefore, by observing both the moire M in the moire display region 3 and the moire M in the moire display region 4, the relative position (inclination angle) between the marker 1 and the observation position can be accurately detected. In other words, the marker 1 can configure a part of an angle sensor by using the marker 1 in combination with the imaging unit and the calculation unit.

Here, when the moire M shifts to a position where the observation position is greatly deviated from the normal direction of the marker 1, it causes another moire to be observed, and moire is observed one after another. Therefore, when the observation position is located at a position which is significantly deviated from the normal direction of the marker 1, it may be impossible to perform correct position detection. However, the marker 1 of the present embodiment includes the marks 2. The position detection based on the marks 2 can be performed even when the observation position is greatly deviated from the normal direction of the marker 1. On the other hand, the position detection using the moire display regions 3 and 4 can be performed with higher accuracy than the position detection based on the marks 2. Therefore, by using the position detection using the marks 2 and the position detection using the moire display regions 3 and 4 together with each other, the applicable range can be expanded as compared with the case where only the moire display regions 3 and 4 are used. In other words, even when the observation position is significantly deviated from the normal direction of the marker 1, it is possible to perform the position detection based on the marks 2, automatically shift the observation position according to the detection result, and perform the position detection using the moire display regions 3 and 4 at a stage where final high-accuracy position control is required.

As described above, it is assumed that the relative position between the observation position and the marker 1 is set to have various positional relationships. Therefore, the relative position may have such a positional relationship that illumination light, sunlight, or the like is specularly reflected to the observation position. Even in such a case, since the marker 1 of the present embodiment has the light diffusion layer 80, the reflected light can be appropriately diffused, and it is possible to multiply situations that the marks 2 of the marker and the moire display regions 3 and 4 are observable.

As described above, according to the marker 1 of the present embodiment, it is possible to improve the situation where it is difficult to recognize an index or the like indicated by the marker 1 due to illumination light or the sunlight, and provide a marker which is easy to recognize even in such an environment that the sunlight, illumination light or the like hits the marker.

Six Embodiment

Figure 27:
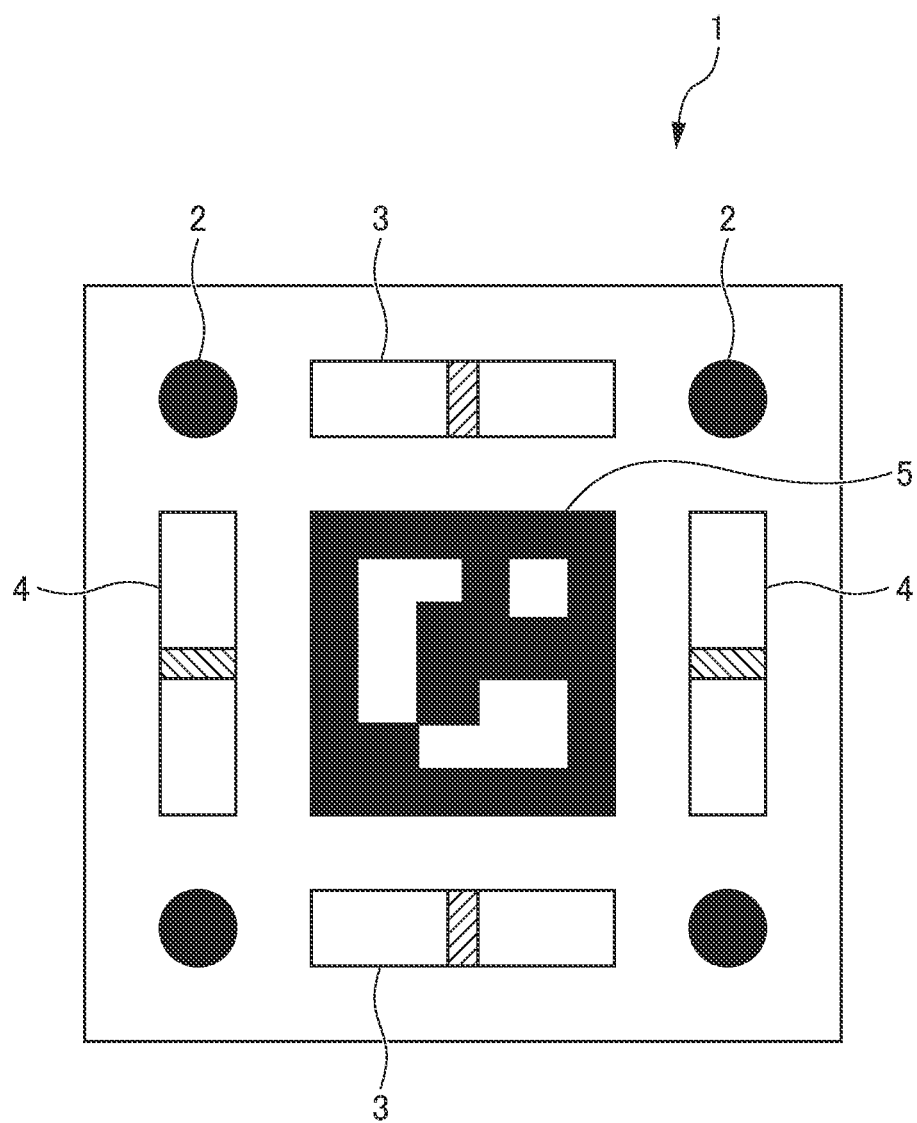
FIG. 27 is a diagram showing a fifth embodiment of the marker according to the present invention.

FIG. 27 is a diagram showing a fifth embodiment of the marker according to the present invention. The marker 1 of the fifth embodiment includes marks 2, moire display regions 3 and 4, and an identification mark 5. The marker 1 of the fifth embodiment is the same as the other embodiments described above except that the arrangement of the marks 2 and the moire display regions 3 and 4 is different and the identification mark 5 is provided. Therefore, the same reference numerals are given to portions that perform the same functions as those of the above-described embodiments, and duplicative description thereon will be omitted as appropriate.

In the present embodiment, the marks 2 are provided near four corners. The moire display regions 3 are respectively provided in the vicinity of the upper and lower end portions in FIG. 27. The moire display regions 4 are respectively provided in the vicinity of the left and right end portions in FIG. 27. The identification mark 5 is provided in the center of the marker 1. The identification mark 5 is a pattern figure (a figure for identification) that is associated with a specific meaning by a pattern of the mark and indicates unique information by the pattern. For example, the identification mark 5 is associated with a unique number, an alphabet, or the like for each different pattern. As the identification mark 5 may be used a two-dimensional bar code, a three-dimensional bar code, a QR code (registered trademark), ArUco, or the like. As described above, various known identification codes and the like can be used as the identification mark 5, but the identification mark 5 is configured so that the number of patterns is reduced and the size of the pattern is increased as in the present embodiment, which facilitates detection by the camera.

Figure 28:
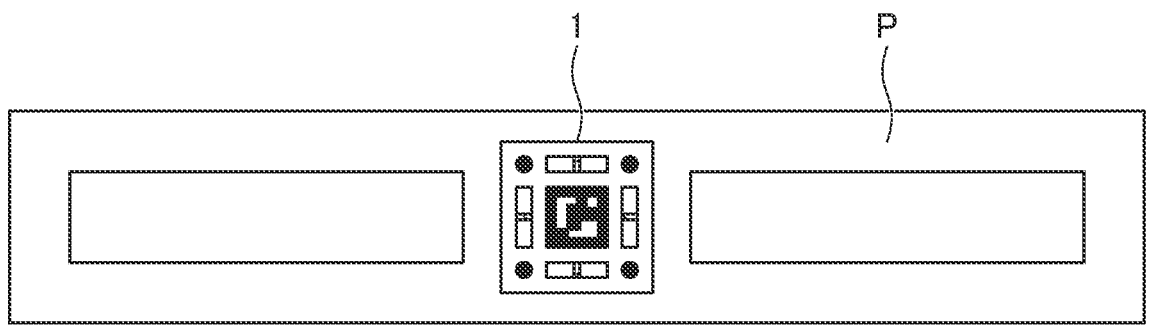
FIG. 28 is a diagram showing a pallet P to which the marker 1 of the fifth embodiment is attached.

FIG. 28 is a diagram showing a pallet P to which the marker 1 of the fifth embodiment is attached. The marker 1 of the present embodiment is attached to a pallet P to be used, for example, for physical distribution, and can be used to identify the pallet P as a detection target. Therefore, for example, from a photographing result by a camera of an automatic operating forklift, it is possible to accurately grasp the relative positional relationship between the forklift and a pallet and control the operation of the forklift based on the relative positional relationship, and further it is possible to identify pallets P individually. A method of attaching the marker 1 to a detection target may be a method using, for example, an adhesive or glue, or a method of providing a pallet P with an attachment shape for attaching the marker 1 and detachably attaching the marker 1 to the attachment shape.

According to the marker 1 of the present embodiment, since it is provided with the identification mark 5, it can be used not only for position detection as in the other embodiments described above, but also for identifying a target to which the marker 1 is attached. Although the marker 1 having the moire display regions 3 and 4 is illustrated in FIGS. 27 and 28, the purpose of the moire display region is to measure the inclination of the marker with high accuracy, and thus the moire display region may be omitted when the measurement accuracy achieved by using the marks 2 alone is sufficient for the purpose.

Further, when the marker 1 is attached to the pallet P used for physical distribution, it is preferable that the protective layers 70 and 70C are laminated via the adhesive layer 60. For example, even when the claw of a forklift hits the marker 1, the protective layers 70 and 70C function as a scattering prevention layer, so that fragments of the base material layer 10 are prevented from scattering. This is because even when the base material layer 10 is cracked, the first layers 20 and 20C and the second layers 30 and 30C are not damaged and thus can maintain the function as markers.

Modified Forms

Various modifications and alterations are possible without being limited to the above-described embodiments, and these modifications and alterations are also within the scope of the present invention.

Figure 12:
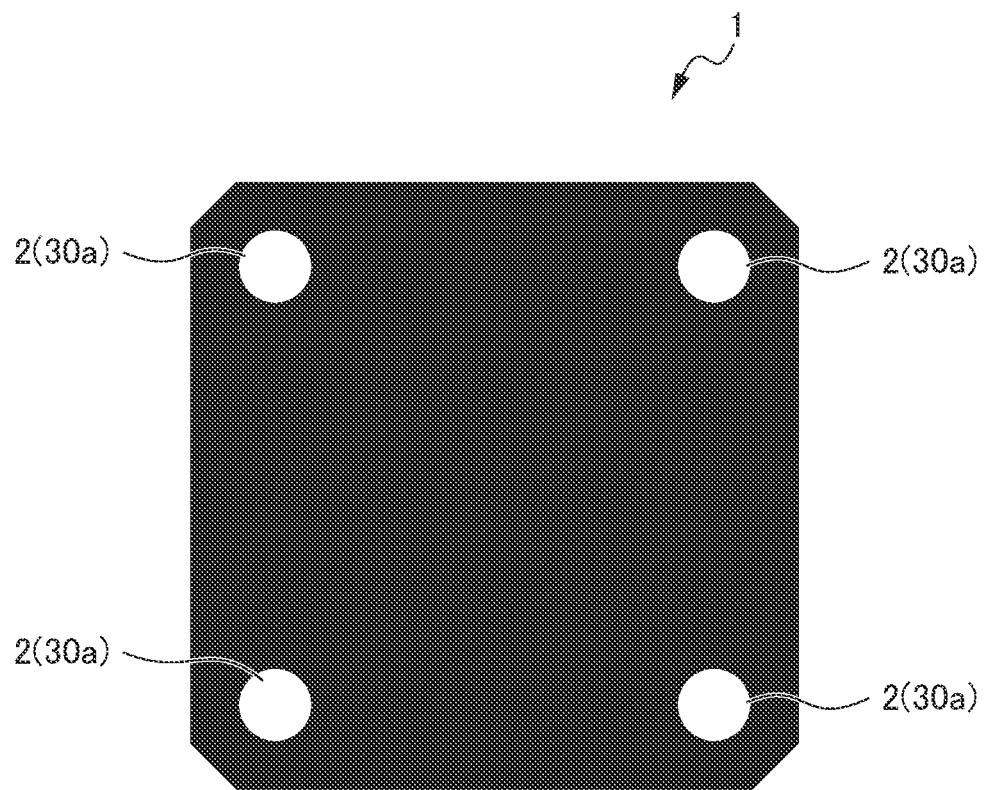
FIG. 12 is a diagram showing a modified form in which a first layer 20 is set to white and a second layer 30 is set to black in the first embodiment.
Figure 13:
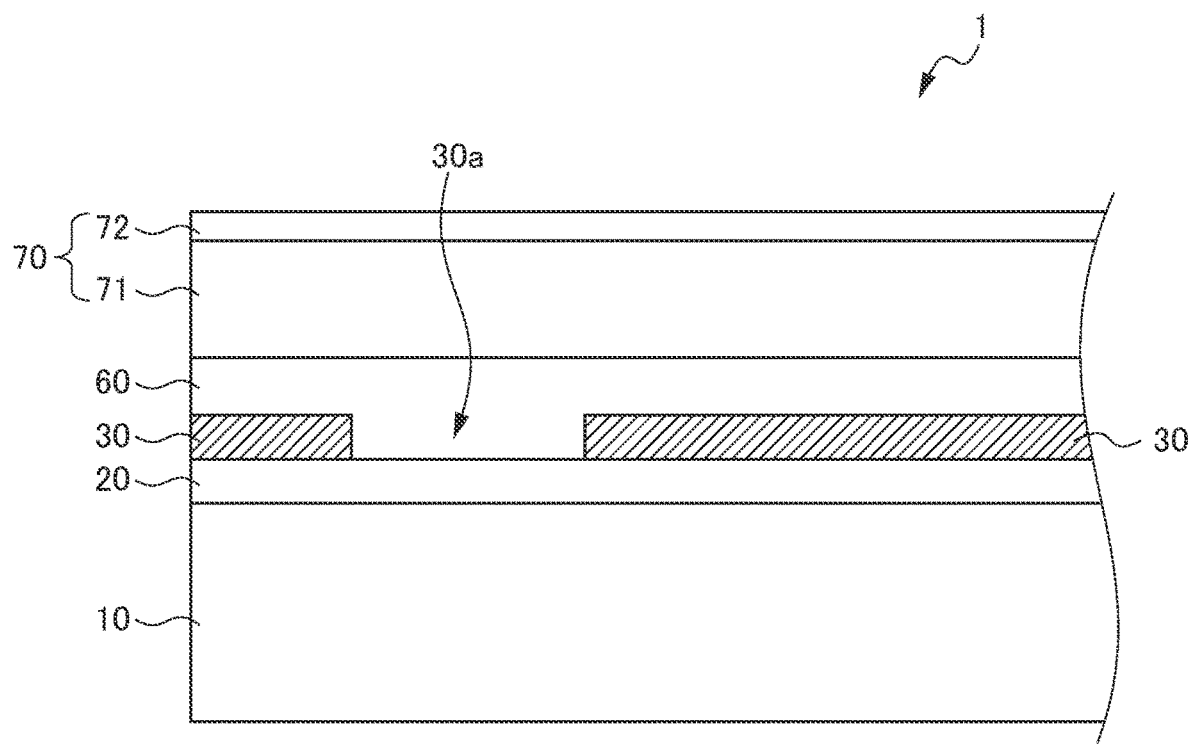
FIG. 13 is a diagram showing a modified form in which the first layer 20 is set to white and the second layer 30 is set to black in the first embodiment.
Figure 14:
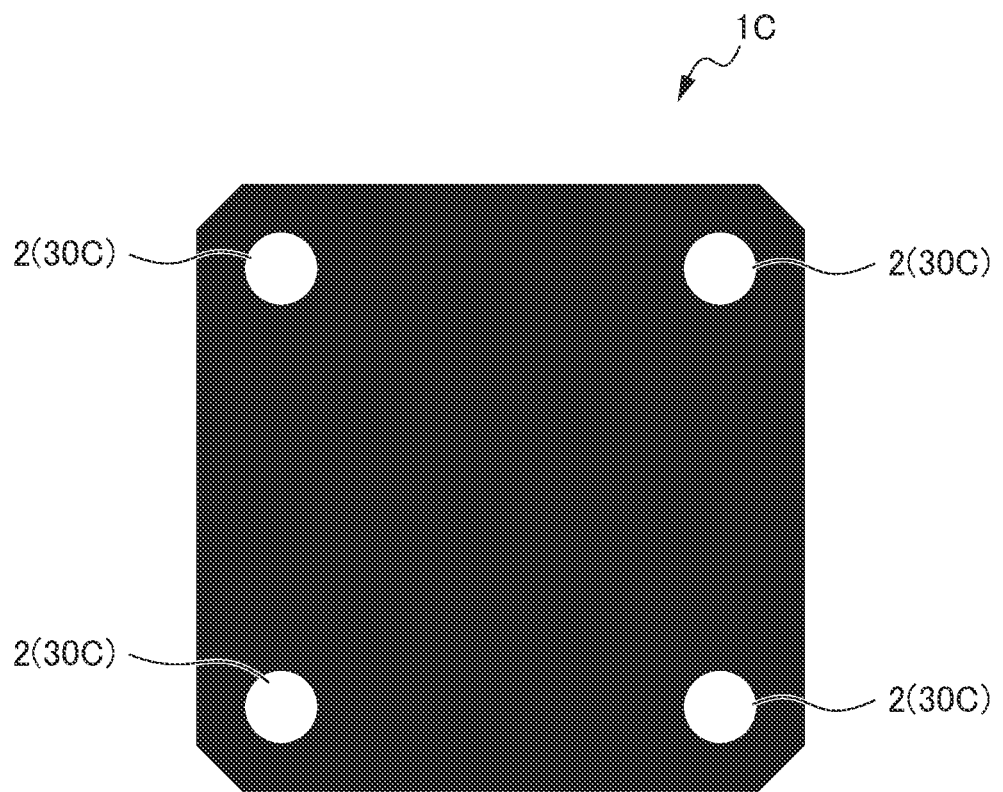
FIG. 14 is a diagram showing a modified form in which a first layer 20C is set to black and a second layer 30C is set to white in the third embodiment.
Figure 15:
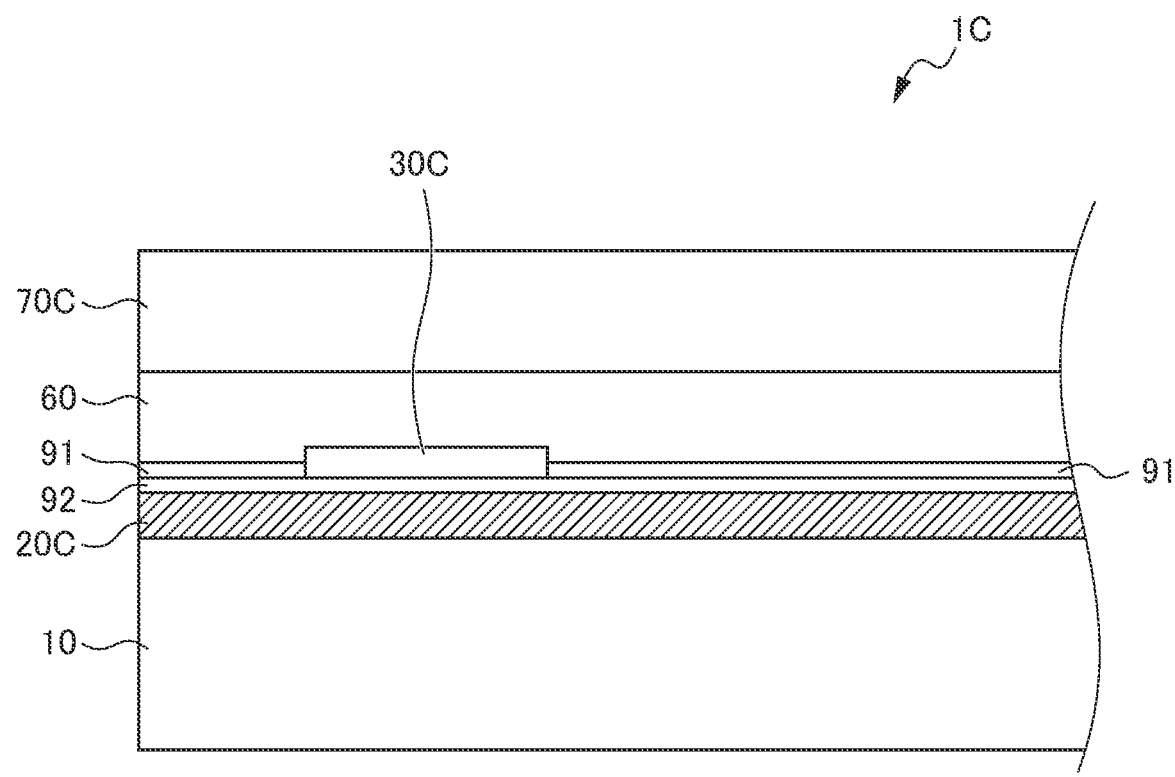
FIG. 15 is a diagram showing a modified form in which the first layer 20C is set to black and the second layer 30C is set to white in the third embodiment.

(1) The first to third embodiments have been described by presenting the example in which the marker is configured so that the marks 2 are black and the peripheries thereof are white. Not limited to this example, for example, the marks 2 may be white and the peripheries thereof may be black. More specifically, for example, in the first embodiment, the first layer 20 may be white, and the second layer 30 on the observation side may be black. FIGS. 12 and 13 are diagrams showing a modified form in which the first layer 20 is white and the second layer 30 is black in the first embodiment. As shown in FIG. 13, the first layer 20 of the first embodiment is made white and the second layer 30 on the observation side is made black, whereby the marks 2 are white like the marker 1 shown FIG. 12, and the peripheries thereof are black. Further, for example, in the third embodiment, the first layer 20C may be black, and the second layer 30C on the observation side may be white. FIGS. 14 and 15 are diagrams showing a modified form in which the first layer 20C is black and the second layer 30C is white in the third embodiment. As shown in FIG. 15, the first layer 20C of the third embodiment is made black and the second layer 30 on the observation side is made white, whereby the marks 2 are white like the marker 1C shown in FIG. 14, and the peripheries thereof are black.

(2) The first to third embodiments have been described by presenting the example in which the marks 2 are represented with two colors of black and white. Not limited to this example, the embodiments may be configured so that the marker may be configured by combining other colors such as blue and yellow. Further, by adding a third layer to be observed in a third color, the embodiments may be configured so that a larger number of layers to be observed in three or more colors are laminated. Further, the difference in color in the present invention is not limited to the difference in color expressed by the combination of RGB, but can also include a difference caused by multi-gradation expression of a single color.

(3) The first to third embodiments have been described by presenting the example in which the marks 2 are enabled to be observed under visible light. Not limited to this example, the embodiments may be configured so that the marks 2 are detected by using light in a specific wavelength region such as an infrared ray region (near-infrared ray wavelength region of 780 nm or more). More specifically, the embodiments may be configured, for example, so that the marks 2 are observable in the near-infrared ray region, but the marks 2 are not observable or inconspicuous in a white light (visible light) region. If the marks 2 are formed of a near-infrared ray absorbing material, the marks 2 can be identified by a near-infrared ray receiving element only when the marks 2 are irradiated with near-infrared ray, but the marks 2 cannot be identified by human's eye. As the near-infrared ray absorbing material may be used known materials such as ITO, ATO, cyanine compound, phthalocyanine compound, di-thiol metal complex, naphthoquinone compound, diimmonium compound, and azo compound. As a result, it is possible to use the marker 1 (1B) for applications where it is desired to make the marker 1 (1B) inconspicuous. In such a case, it is desirable that the contrast value between the first color of the first layer 20 and the second color of the second layer 30 is equal to or more than 0.26 under observation using light in a specific wavelength region, whereas the contrast value between the first color and the second color is equal to or less than 1.0 under visible light. This makes it possible to make the marker inconspicuous under visible light and implement highly accurate position detection with light in a specific wavelength region.

(4) In the first to third embodiments, the configuration in which the protective layer 70 is stuck via the adhesive layer 60 is illustrated. Not limited to this example, the embodiments may be configured, for example, so that the protective layer is directly laminated on the second layer 30, or the protective layer may be omitted depending on the usage environment.

(5) The first to third embodiments have been described by presenting the example in which the masks M are used in the second exposure step of exposing the second layer 30 to light via a mark pattern. Not limited to this example, for example, exposure of a mark pattern may be performed by a direct drawing method using a laser beam.

(6) The first to third embodiments have been described by presenting the example in which the first layer 20 is observable as a mark having an independent shape. Not limited to this example, for example, the embodiments may be configured so that the second layer 30 is observable as a mark having an independent shape. In connection with this, the resist material forming the second layer 30 may be a positive type or a negative type.

(7) In the first to third embodiments, a layer for improving adhesion, a layer for improving surface nature, a layer for diffusing light to provide antiglare, or the like may be inserted as appropriate between layers, onto the outermost surface, or the like.

Figure 16:
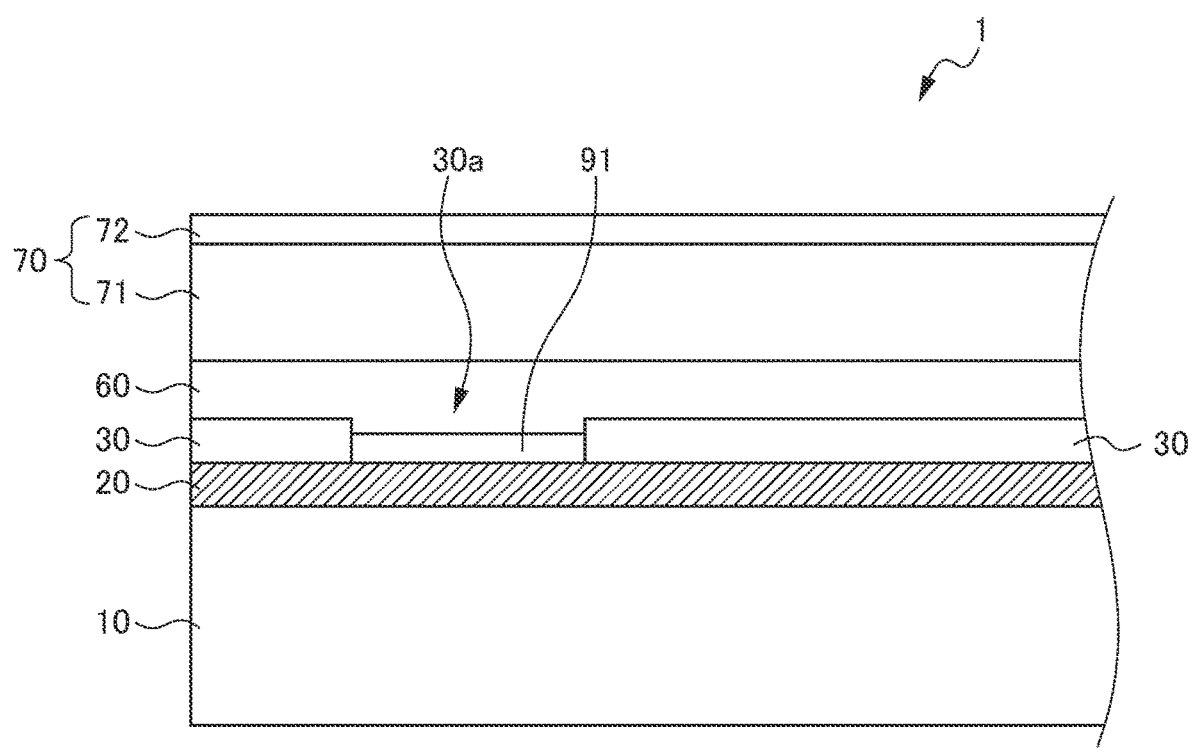
FIG. 16 is a cross-sectional view showing a modified form in which a flattening layer 91 is provided in an opening portion 30a of the second layer 30 in the first embodiment.

(8) The third embodiment has been described by presenting the example in which the flattening layer 91 is provided. Such a flattening layer may be provided in the first embodiment. FIG. 16 is a cross-sectional view showing a modified form in which the flattening layer 91 is provided in the opening portion 30a of the second layer 30 of the first embodiment. It is possible to prevent occurrence of voids by providing the flattening layer 91 in the opening portion 30a of the second layer 30 as shown in FIG. 16. Further, in the form of FIG. 16 and the third embodiment, an example in which the height of the flattening layer 91 is lower than those of the second layers 30 and 30C is shown. However, the flattening layer 91 may be slightly higher than those of the second layers 30 and 30C, more desirably the same height as the second layers 30, 30C.

(9) The fourth embodiment has been described by presenting the example in which the first layer 20 is black and the second layer 30 is white. Not limited to this example, the embodiment may be configured, for example, so that the first layer 20 is white and the second layer 30 is black, or may be configured not only by combining black and white, but also by combining other colors such as blue and yellow.

(10) The fourth embodiment has been described by presenting the example in which the black portion of the mark 2 and the first pattern 23 are formed by the first layer 20. Not limited to this example, for example, the mark 2 and the first pattern 23 may be provided on different layers.

(11) In the fourth embodiment, the configuration in which the protective layer 70 is stuck by the adhesive layer 60 is illustrated. Not limited to this example, for example, the embodiment may be configured so that the protective layer is directly laminated on the second layer 30, or the protective layer may be omitted depending on the usage environment.

(12) The fourth embodiment has been described by presenting the example in which the moire display region 3 and the moire display region 4 are arranged so that the longitudinal directions thereof are orthogonal to each other. Not limited to this example, for example, a moire display region may be further added. In this case, the longitudinal direction of the added moire display region may be arranged in a direction which intersects the moire display region 3 and the moire display region 4 at an angle of 45 degrees or the like. With such a configuration, the accuracy of position detection can be further improved.

(13) In the fifth embodiment, the light diffusion layer has been described by presenting the example in which the sheet-like member is stuck. Not limited to this example, for example, the light diffusion layer may be configured by coating a resin or the like forming the light diffusion layer.

(14) The fifth embodiment has been described by presenting the example in which the light diffusion layer has micro asperities on the surface. Not limited to this example, for example, the light diffusion layer may be configured so as to have light-diffusing particles therein, or may be configured so as to have both micro asperities on the surface thereof and the light-diffusing particles therein.

(15) The fifth embodiment has been described by presenting the example in which the light diffusion layer is partially provided in an island-like shape. Not limited to this example, for example, the light diffusion layer may be provided on the entire surface of the marker.

Figure 26:
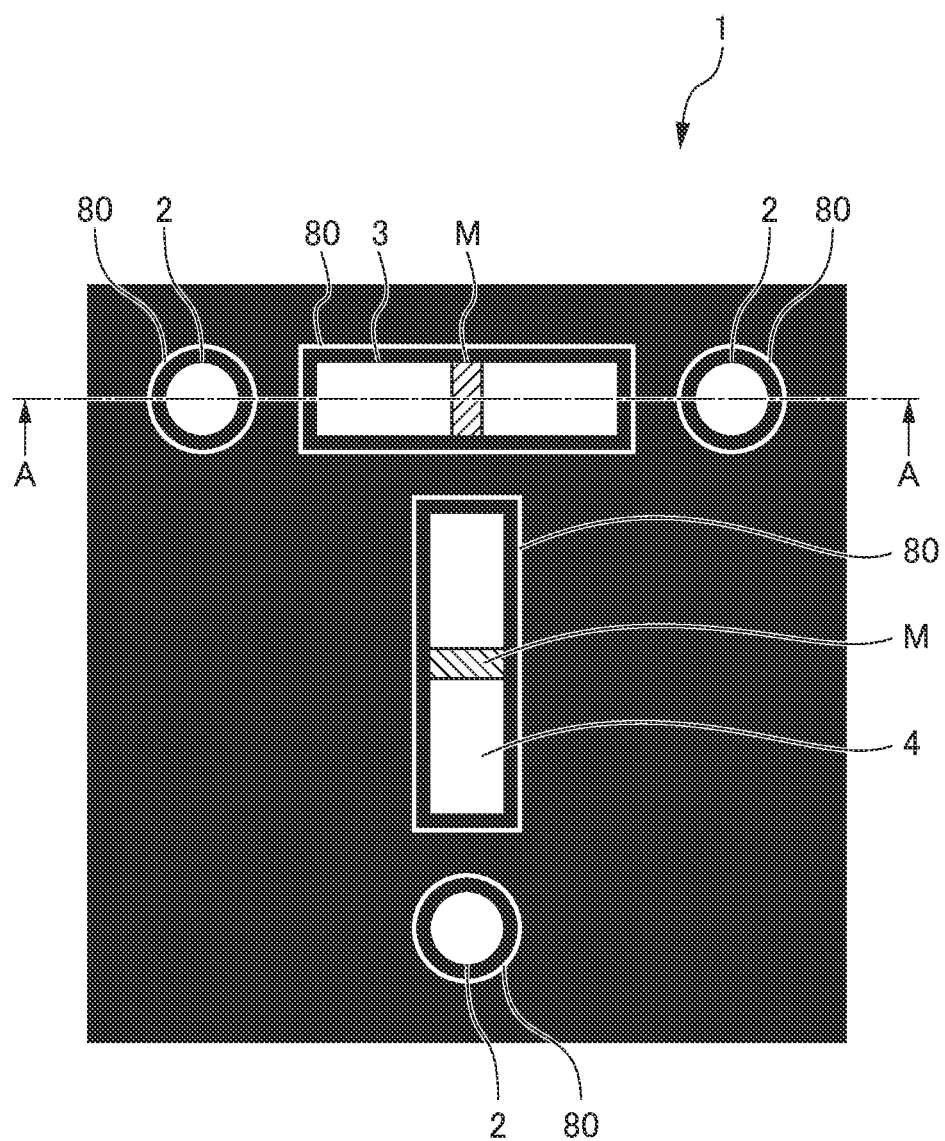
FIG. 26 is a diagram showing a modified form in which the colors of the first layer 20 and the second layer 30 are exchanged by each other.

(16) The fifth embodiment has been described by presenting the example in which the first layer 20 is black and the second layer 30 is white. Not limited to this example, for example, as shown in FIG. 26, the first layer 20 may be made white, the second layer 30 may be made black, or the fifth embodiment may be configured not only by combining black and white, but also by combining other colors such as blue and yellow. Further, a third layer to be observed in a third color may be added so that a larger number of layers to be observed in three or more colors are laminated. Further, the difference in color in the present invention is not limited to the difference in color expressed by the combination of RGB, but can also include a difference caused by multi-gradation expression of a single color.

(17) Each embodiment has been described by presenting the example in which both the first layer 20 and the second layer 30 are configured by using a resist material. Not limited to this example, for example, the first layer 20 and the second layer 30 may be configured by using a method of laminating a thermosetting resin on a necessary portion by an inkjet method or the like. Even in such a case, the linear expansion coefficient of the base material layer 10 is set to $10 \times 10^{-6}/°$ C. or less, whereby it is possible to secure sufficient accuracy depending on the application.

Although the respective embodiments and modified forms can be used in combination as appropriate, detailed description thereon will be omitted. Further, the present invention is not limited to the respective embodiments described above.

EXPLANATION OF REFERENCE NUMERALS

1, 1B, 1C: Marker
2: Mark
3, 4: Moire display region
10: Base material layer
20, 20C: First layer
21: First display line
22: First non-display region
23: First pattern
30, 30C: Second layer
30a: Opening portion
31: Opening portion
32: opening portion
40: Third layer
41: Second display line
42: Second non-display region
43: Second pattern
50: Reflective layer
60: Adhesive layer
70: Protective layer
71: Resin base material layer
72: Surface layer
80: Light diffusion layer
81: Resin base material layer
82: Surface layer
91: Flattening layer
92: Intermediate layer
100: Marker multi-imposition body

The invention claimed is:

1. A marker for measurement of at least one of a position and an orientation from a camera, comprising:
   a base material layer;
   a first layer that is laminated on an observation side of the base material layer, and is detected in a first color; and
   a second layer that is partially laminated on an observation side of the first layer, is detected in a second color different from the first color, and partially conceals the first layer,
   the first layer being detectable in a region where the second layer is not laminated, and
   the second layer including a resist material, wherein:
   a plurality of marks are formed from the first and second layers, are each positioned at a corner region of the marker, and are configured to provide information on a relative orientation of the marker with respect to a camera that captures an image of the marker,
   the marker is configured to be attached to a target,
   when the camera captures an image of the attached marker, the at least one of the position and the orientation from the camera is determined from how the plurality of marks each provided at the corner region of the marker are displayed in the captured image, and
   the determination of the at least one of the position and the orientation allows an automatic control device to recognize the target and perform automatic control.

2. The marker according to claim 1, wherein the first layer includes a resist material.

3. The marker according to claim 1, wherein the base material layer has a linear expansion coefficient of $10 \times 10^{-6}/°$ C. or less.

4. The marker according to claim 1, wherein the base material layer includes glass.

5. The marker according to claim 1, wherein a light that makes the first layer and the second layer detectable is in a near-infrared ray wavelength region of 780 nm or more.

6. The marker according to claim 1,
wherein one of the first color and the second color is white, and the other is black.

7. The marker according to claim 1,
wherein one of the first layer and the second layer is detectable as a mark having an independent shape, and
each of the plurality of marks, positioned at the respective corner region of the marker, has the independent shape.

8. A marker multi-imposition body for measurement of at least one of a position and an orientation from a camera, comprising:
a plurality of markers, each marker formed according to claim 7, the plurality of markers being arranged in a multi-imposition style,
wherein dimensional variation in external shapes of the marks on one sheet of the multi-imposition body and dimensional variation in arrangement pitches between the marks in each of the markers are each ±10 µm or less.

9. The marker according to claim 7,
wherein the plurality of marks include three or more marks that are each positioned at the respective corner region of the marker so as to be spaced from one another, and
a figure for identification is arranged at a center portion of the marker.

10. The marker according to claim 9,
wherein the figure for identification is one of a two-dimensional bar code, a three-dimensional bar code, a QR code, and ArUco.

11. A method for manufacturing the marker according to claim 1, comprising:
a first layer forming step of laminating a first layer including a resist material and to be detected in a first color on one surface of a base material layer including glass;
a first exposure step of exposing the first layer to light;
a first developing step of developing the first layer;
a first baking step of baking the first layer,
a second layer forming step of laminating a second layer including a resist material and to be detected in a second color on the first layer which has been stabilized;
a second exposure step of exposing the second layer to light via a mark pattern;
a second developing step of developing the second layer; and
a second baking step of baking the second layer, wherein:
a plurality of marks are formed from the first and second layers, are each positioned at a corner region of the marker, and are configured to provide information on a relative orientation of the marker with respect to a camera that captures an image of the marker,
the marker is configured to be attached to a target, when the camera captures an image of the attached marker, the at least one of the position and the orientation from the camera is determined from how the plurality of marks each provided at the corner region of the marker are displayed in the captured image, and
the determination of the at least one of the position and the orientation allows an automatic control device to recognize the target and perform automatic control.

12. The marker according to claim 1, comprising:
a first pattern that is provided in at least a partial region on one surface of the base material layer, and has a plurality of first display lines arranged at equal intervals in a fixed arrangement direction; and
a second pattern that is provided to be spaced from the first pattern in a thickness direction of the base material layer, and has a plurality of second display lines arranged at equal intervals in the fixed arrangement direction,
the marker having a moire display region for displaying moire by a combination of the first pattern and the second pattern,
wherein when a portion which is located between adjacent first display lines and is provided with no first display line is defined as a first non-display region, and
a portion which is located between adjacent second display lines and is provided with no second display line is defined as a second non-display region,
the first non-display region and the second non-display region have different widths.

13. The marker according to claim 12,
the width of the first non-display region is larger than the width of the second non-display region, and
a side on which the first pattern is provided is set as the observation side.

14. The marker according to claim 13,
wherein a reflective layer is laminated on a back surface side which is opposite to the observation side such that at least the second non-display region is filled with the reflective layer.

15. The marker according to claim 1,
wherein the marker is configured to be used for detection of a distance to an observation position and a relative inclination angle to the observation position, and the marker is provided with a light diffusion layer on an outermost surface thereof.

16. A detection target, which is the target to which the marker according to claim 1 is attached.

17. The marker according to claim 1,
wherein the plurality of marks are formed from the first and second layers so that:
when a cross-sectional shape of a portion of the first and second layers corresponding to each of the marks is concave, each of the marks is detected in the first color, and
when the cross-sectional shape of the portion of the first and second layers corresponding to each of the marks is convex, each of the marks is detected in the second color.

18. A plate-shaped marker for measurement of at least one of a position and an orientation from a camera, comprising:
a base material layer;
a first layer that is laminated on an observation side of the base material layer, and is laminated on an entire surface of the base material layer and detected in a first color; and
a second layer that is partially laminated on an observation side of the first layer, is detected in a second color different from the first color, and partially conceals the first layer,
wherein the first layer is detectable in a region where the second layer is not laminated, the second layer including a resist material, and
the base material layer has a linear expansion coefficient of $10 \times 10^{-6}/°$ C. or less, wherein:
a plurality of marks are formed from the first and second layers, are each positioned at a corner region of the plate-shaped marker, and are configured to provide information on a relative orientation of the plate-shaped marker with respect to a camera that captures an image of the plate-shaped marker, the plate-shaped marker is configured to be attached to a target, when the camera captures an image of the attached plate-shaped marker, the at least one of the position and the orientation from the camera is determined from how the plurality of marks each provided at the corner region of the plate-shaped marker are displayed in the captured image, and the determination of the at least one of the position and the orientation allows an automatic control device to recognize the target and perform automatic control.

19. The plate-shaped according to claim 18,
wherein the base material layer includes glass.

20. The plate-shaped according to claim 18,
wherein one of the first layer and the second layer is detectable as a mark having an independent shape, and
each of the plurality of marks, positioned at the respective corner region of the marker, has the independent shape.

21. The plate-shaped according to claim 20,
wherein the plurality of marks include three or more marks that are each positioned at the respective corner region of the plate-shaped marker so as to be spaced from one another, and
a figure for identification is arranged at a center portion of the plate-shaped marker.

22. The plate-shaped according to claim 21,
wherein the figure for identification is one of a two-dimensional bar code, a three-dimensional bar code, a QR code, and ArUco.

23. The plate-shaped according to claim 18,
wherein the plurality of marks are detectable using light in a near-infrared ray wavelength region of 780 nm or more.

* * * * *